(12) United States Patent
Taguchi et al.

(10) Patent No.: US 10,241,247 B2
(45) Date of Patent: Mar. 26, 2019

(54) COLORING COMPOSITION, METHOD FOR PRODUCING COLORING COMPOSITION, COLOR FILTER, PATTERN FORMING METHOD, METHOD FOR MANUFACTURING COLOR FILTER, SOLID-STATE IMAGING DEVICE, AND IMAGE DISPLAY DEVICE

(71) Applicant: FUJIFILM Corporation, Tokyo (JP)

(72) Inventors: Yoshinori Taguchi, Haibara-gun (JP); Tetsuya Kamimura, Haibara-gun (JP); Akiko Yoshii, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 92 days.

(21) Appl. No.: 15/614,742

(22) Filed: Jun. 6, 2017

(65) Prior Publication Data

US 2017/0269270 A1 Sep. 21, 2017

Related U.S. Application Data

(63) Continuation of application No. PCT/JP2015/082391, filed on Nov. 18, 2015.

(30) Foreign Application Priority Data

Dec. 25, 2014 (JP) .................. 2014-263069
Nov. 10, 2015 (JP) .................. 2015-220392

(51) Int. Cl.

| G02B 5/20 | (2006.01) |
|---|---|
| G03F 7/004 | (2006.01) |
| G02B 5/22 | (2006.01) |
| C09B 29/33 | (2006.01) |
| C09B 57/04 | (2006.01) |
| G03F 7/033 | (2006.01) |
| C08G 18/32 | (2006.01) |
| C08G 18/34 | (2006.01) |
| G03F 7/032 | (2006.01) |
| G03F 7/038 | (2006.01) |
| C08G 18/81 | (2006.01) |
| C09B 67/22 | (2006.01) |
| C08G 18/28 | (2006.01) |
| G03F 7/00 | (2006.01) |
| G03F 7/105 | (2006.01) |
| G02F 1/1335 | (2006.01) |

(52) U.S. Cl.
CPC .......... *G02B 5/223* (2013.01); *C08G 18/284* (2013.01); *C08G 18/329* (2013.01); *C08G 18/348* (2013.01); *C08G 18/8116* (2013.01); *C09B 29/33* (2013.01); *C09B 57/04* (2013.01); *C09B 67/0033* (2013.01); *C09B 67/0034* (2013.01); *G03F 7/004* (2013.01); *G03F 7/0007* (2013.01); *G03F 7/032* (2013.01); *G03F 7/033* (2013.01); *G03F 7/0388* (2013.01); *G03F 7/105* (2013.01); *G02F 1/133514* (2013.01)

(58) Field of Classification Search
CPC ........ G03F 7/0007; G03F 7/028; G03F 7/031; G03F 7/032; G03F 7/033; G03F 7/0388; G03F 7/105; G02B 5/223; G02F 1/133514; G02F 1/133516
USPC ....................... 430/7, 270.1, 281.1
See application file for complete search history.

(56) References Cited

U.S. PATENT DOCUMENTS

| 2009/0059138 A1* | 3/2009 | Matsumoto ............ B82Y 30/00 349/106 |
|---|---|---|
| 2009/0082487 A1 | 3/2009 | Kanda |
| 2011/0014401 A1 | 1/2011 | Fujimaki et al. |
| 2017/0235225 A1* | 8/2017 | Murata ..................... C08F 2/44 430/281.1 |

FOREIGN PATENT DOCUMENTS

| JP | 10-300920 A | 11/1998 |
|---|---|---|
| JP | 2009-096977 A | 5/2009 |
| JP | 2010-006968 A | 1/2010 |
| JP | 2013-068814 A | 4/2013 |
| JP | 2014-178676 A | 9/2014 |
| JP | 2015-079161 A * | 4/2015 |
| KR | 1020100124767 A | 11/2010 |
| KR | 1020130032243 A | 4/2013 |
| WO | 2009/116442 A1 | 9/2009 |
| WO | WO 2015/056549 A1 * | 4/2015 |

OTHER PUBLICATIONS

Computer-generated translation of JP 2015-079161 (Apr. 2015). (Year: 2015).*
Communication dated May 1, 2018, issued by the Korean Intellectual Property Office in corresponding Korean Application No. 10-2017-7015623.
Written Opinion of the International Searching Authority of PCT/JP2015/082391 dated Feb. 16, 2016.
International Search Report of PCT/JP2015/082391 dated Feb. 16, 2016.
Communication dated Mar. 27, 2018, from the Japanese Patent Office in counterpart Japanese application No. 2016-566038.
Communication dated Nov. 6, 2018 from the Korean Patent Office in counterpart application No. 10-2017-7015623.

* cited by examiner

*Primary Examiner* — John A McPherson
(74) *Attorney, Agent, or Firm* — Sughrue Mion, PLLC

(57) ABSTRACT

A coloring composition includes Color Index Pigment Red 264, a graft resin having an acid group, a photopolymerizable compound, and a photopolymerization initiator.

20 Claims, 1 Drawing Sheet

COLORING COMPOSITION, METHOD FOR PRODUCING COLORING COMPOSITION, COLOR FILTER, PATTERN FORMING METHOD, METHOD FOR MANUFACTURING COLOR FILTER, SOLID-STATE IMAGING DEVICE, AND IMAGE DISPLAY DEVICE

CROSS-REFERENCE TO RELATED APPLICATIONS

This application is a Continuation of PCT International Application No. PCT/JP2015/082391 filed on Nov. 18, 2015, which claims priority under 35 U.S.C § 119(a) to Japanese Patent Application No. 2014-263069 filed on Dec. 25, 2014 and Japanese Patent Application No. 2015-220392 filed on Nov. 10, 2015. Each of the above application(s) is hereby expressly incorporated by reference, in its entirety, into the present application.

BACKGROUND OF THE INVENTION

1. Field of the Invention

The present invention relates to a coloring composition. The present invention further relates to a method for producing a coloring composition, a pattern forming method using the coloring composition, a method for manufacturing a color filter, a solid-state imaging element including the color filter, and an image display device.

2. Description of the Related Art

Recently, there is a growing demand for solid-state imaging element such as a charge coupled device (CCD) image sensor along with the widespread use of digital cameras, mobile phones with cameras, and the like. Color filters are used as key devices of these displays or optical elements, and increasingly required to be more sensitive and smaller. Such color filters typically have a colored pattern of three primary colors, that is, red (R), green (G), and blue (B), and have a role of decomposing the transmitted light into the three primary colors.

It has been proposed to use, for example, Color Index (C. I.) Pigment Red 264 as a colorant for forming a red colored pattern (red pixel unit) in a color filter (JP2014-178676A, JP2010-6968A, and JP1998-300920A (JP-H10-300920A)).

SUMMARY OF THE INVENTION

However, it cannot be said that with the coloring compositions disclosed in JP2014-178676A, JP2010-6968A, and JP1998-300920A (JP-H10-300920A), the performance is sufficient, and the coloring compositions tended to make it difficult to form a color filter having good characteristics.

Therefore, it is an object of the present invention to provide a coloring composition capable of forming a color filter having good characteristics, a method for producing a coloring composition, a color filter, a pattern forming method, a method for manufacturing a color filter, a solid-state imaging element, and an image display device.

The present inventors have conducted extensive studies, and as a result, they have found that the objects can be accomplished by using a combination of C. I. Pigment Red 264 and a graft resin having an acid group, thereby leading to completion of the present invention. The present invention provides the following aspects.

<1> A coloring composition comprising Color Index Pigment Red 264, a graft resin having an acid group, a photopolymerizable compound, and a photopolymerization initiator.

<2> The coloring composition as described in <1>, in which the graft resin having an acid group has a base value of 50 mgKOH/g or less.

<3> The coloring composition as described in <1> or <2>, in which the graft resin having an acid group has an acid value of 5 to 150 mgKOH/g.

<4> The coloring composition as described in any one of <1> to <3>, further comprising a pigment derivative having a basic group.

<5> The coloring composition as described in <4>, in which the pigment derivative is a compound represented by the following General Formula (P), $$A\text{-}B\text{-}(\text{-}C\text{-}D\text{-}E)_t \quad (P)$$

in General Formula (P), A represents a group represented by the following General Formula (PA-1) or (PA-2), B represents a single bond or a (t+1)-valent linking group, C represents a single bond, —NR—, —CO—, —CO$_2$—, —SO$_2$—, —O—, —S—, or a group formed of a combination thereof, and R represents a hydrogen atom, an alkyl group, or an aryl group, D represents a single bond, an alkylene group, or an arylene group, E represents —N(Rpa)(Rpb), Rpa and Rpb each independently represent an alkyl group or an aryl group, and t represents an integer of 1 to 5; and

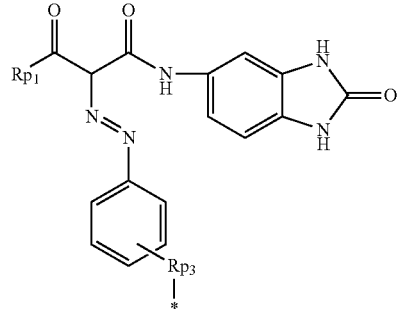

(PA-1)

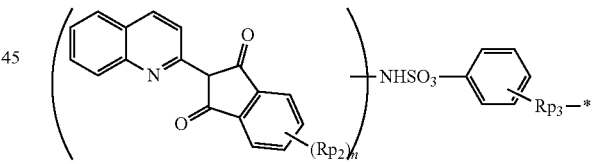

(PA-2)

Rp$_1$ represents an alkyl group or an aryl group,

Rp$_2$ represents a hydrogen atom, a halogen atom, an alkyl group, or a hydroxyl group, Rp$_3$ represents a single bond, —NR—, —CO—, —CO$_2$—, —SO$_2$—, —O—, —S—, or a group formed of a combination thereof, and R represents a hydrogen atom, an alkyl group, or an aryl group, s represents an integer of 1 to 4, and in a case where s is 2 or more, a plurality of Rp$_2$'s may be the same or different from each other, and

* represents a linking moiety to B.

<6> The coloring composition as described in any one of <1> to <5>, further comprising Color Index Pigment Yellow 139.

<7> The coloring composition as described in <6>, in which the mass ratio of Color Index Pigment Red 264 to Color Index Pigment Yellow 139 is 55:45 to 75:25.

<8> The coloring composition as described in any one of <1> to <7>, in which the graft resin having an acid group is a (meth)acrylic resin.

<9> The coloring composition as described in any one of <1> to <8>, in which the graft resin having an acid group has a carboxyl group.

<10> A method for producing the coloring composition as described in any one of <1> to <9>, comprising dispersing a colorant including Color Index Pigment Red 264 in the presence of a graft resin having an acid group.

<11> A color filter formed of the coloring composition as described in any one of <1> to <9>.

<12> A pattern forming method comprising forming a coloring composition layer on a support applying the coloring composition as described in any one of <1> to <9>, exposing the coloring composition layer in a pattern shape, and removing the unexposed area by development to form a colored pattern.

<13> A method for manufacturing a color filter, comprising the pattern forming method as described in <12>.

<14> A solid-state imaging element comprising the color filter as described in <11>.

<15> An image display device comprising the color filter as described in <11>.

According to the present invention, it is possible to provide a coloring composition capable of forming a color filter having good characteristics, or the like. It is also possible to provide a method for producing the above-mentioned coloring composition as well as a color filter, a pattern forming method, a method for manufacturing a color filter, a solid-state imaging element, and an image display device, each of which uses the coloring composition.

DESCRIPTION OF THE PREFERRED EMBODIMENTS

Figure 1A:
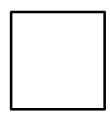
FIGS. 1A to 1E are each a view showing the evaluation standard for pattern shapes.

Hereinafter, the contents of the present invention will be described in detail.

In citations for a group (atomic group) in the present specification, when the group is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, light means actinic ray or radiation. Further, "actinic ray" or "radiation" means, for example, a bright line spectrum of a mercury lamp or the like, far ultraviolet rays represented by an excimer laser, extreme ultraviolet rays (EUV light), X-rays, electron beams, or the like.

In the present specification, "exposure" includes, unless otherwise specified, not only exposure by a mercury lamp, far ultraviolet rays represented by an excimer laser, X-rays, EUV rays, or the like, but also writing by particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining when a solvent is excluded from the entire composition of a coloring composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a polymerizable compound refers to a compound having a polymerizable functional group, and may be a monomer or a polymer. The polymerizable functional group refers to a group involved in a polymerization reaction.

In the present specification, a term "step" includes not only an independent step, but also steps which are not clearly distinguished from other steps if an intended action of the steps is obtained.

In the present specification, the weight-average molecular weight and the number-average molecular weight are defined as a value in terms of polystyrene by gel permeation chromatography (GPC) measurement.

The pigment for use in the present invention means an insoluble colorant compound that is hardly dissolved in a solvent. Typically, it means a colorant compound that is present in the state where it is dispersed as particles in the present composition. Here, the solvent includes any solvents, and examples thereof include the solvents exemplified in the section of a solvent which will be described later. As the pigment used in the present invention, for example, the pigments which are dissolved in an amount of 0.1 g or less, both in 100 g of propylene glycol monomethyl ether acetate at 25° C. and in 100 g of water at 25° C. are preferable.

<Coloring Composition>

The coloring composition of the present invention includes C. I. Pigment Red 264 and a graft resin having an acid group.

When the coloring composition of the present invention has such the configuration, it is possible to effectively suppress the generation of residues after pattern formation as shown in Examples which will be described later. Further, a cured film having a good pattern shape can also be formed. Incidentally, a cured film having brightness unevenness suppressed can also be formed. In addition, it is possible to improve the dispersibility of C. I. Pigment Red 264 and decrease a temporal change in viscosity. Further, generation of aggregates can be suppressed, and thus, when forming a cured film, generation of defects caused by the aggregates can be suppressed.

Hereinafter, the present invention will be described in detail.

<<Colorant>>

<<<C. I. Pigment Red 264>>>

The coloring composition of the present invention includes C. I. Pigment Red 264 as a colorant.

In the coloring composition of the present invention, the content of C. I. Pigment Red 264 is preferably 10% to 80% by mass with respect to the total solid content of the coloring composition. The lower limit is more preferably 20% by mass or more, and still more preferably 30% by mass or more. The upper limit is more preferably 70% by mass or less, and still more preferably 60% by mass or less.

Furthermore, the content of C. I. Pigment Red 264 in the total amount of the colorant is preferably 30% to 100% by mass. The lower limit is more preferably 40% by mass or more, still more preferably 50% by mass or more, and particularly preferably 55% by mass or more. The upper limit is more preferably 90% by mass or less, still more preferably 80% by mass or less, and particularly preferably less than 70% by mass.

<<<Other Colorants>>>

The coloring composition of the present invention may include other colorants, in addition to C. I. Pigment Red 264, and preferably includes other colorants. As other colorants, yellow colorants are preferably used. Other colorants may be either dyes or pigments, with the pigments being preferable, and other colorants may be single or a combination of two or more kinds thereof.

Examples of the pigment include various inorganic pigments or organic pigments known in the art. Further, when it is considered that either inorganic or organic pigments having a high transmittance are preferable, pigments having an average particle diameter which is as small as possible are preferably used, and when the handleability is also considered, the average particle diameter of the pigments is preferably 0.01 to 0.1 µm, and more preferably 0.01 to 0.05 µm.

Examples of the inorganic pigment include metal compounds represented by metal oxides, metal complex salts, or the like. Specific examples thereof include black pigments such as carbon black and titanium black, metal oxides of iron, cobalt, aluminum, cadmium, lead, copper, titanium, magnesium, chromium, zinc, and antimony, and composite oxides of the metals.

Examples of the organic pigments include the following pigments, but the present invention is not limited thereto.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 270, 272, and 279, C. I. Pigment Green 7, 10, 36, 37, 58, and 59, C. I. Pigment Violet 1, 19, 23, 27, 32, 37, and 42, C. I. Pigment Blue 1, 2, 15, 15:1, 15:2, 15:3, 15:4, 15:6, 16, 22, 60, 64, 66, 79, and 80, and C. I. Pigment Black 1.

Furthermore, as a green pigment, a halogenated zinc phthalocyanine pigment having 10 to 14 halogen atoms on average in the molecular, 8 to 12 bromine atoms on average, and 2 to 5 chlorine atoms on average can also be used. Specific examples thereof include the compounds described in WO2015/118720A.

Furthermore, as the yellow pigment, the quinophthalone pigments described in paragraphs 0011 to 0034 of JP2013-54339A, the quinophthalone pigments described in paragraphs 0013 to 0058 of JP2014-26228A, or the like can also be used.

These organic pigments may be used singly or in combination of various pigments to improve color purity.

Among those, at least one selected from C. I. Pigment Yellow 139, C. I. Pigment Yellow 150, and C. I. Pigment Yellow 185 is preferable, at least one selected from C. I. Pigment Yellow 139 and C. I. Pigment Yellow 185 is more preferable, and C. I. Pigment Yellow 139 is particularly preferable. According to this aspect, spectral characteristics that are preferable from the viewpoint of color reproducibility are obtained. In addition, the dispersion stability of the composition is improved.

As the dye, the colorants disclosed in, for example, JP1989-90403A (JP-S64-90403A) JP1989-91102A (JP-S64-91102A), JP1989-94301A (JP-H01-94301A), JP1994-11614A (JP-H06-11614A), JP2592207B, U.S. Pat. No. 4,808,501A, U.S. Pat. No. 5,667,920A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), and JP1994-194828A (JP-H06-194828A) can be used. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothioazine compound, a pyrrolopyrazoleazomethine compound, or the like can be used. As the yellow dye, azo dyes described in paragraphs 0007 to 0024 of JP2011-184493A, azo dyes described in paragraphs 0009 to 0033 of JP2011-145540A, thiazole dyes described in paragraphs 0007 to 0019 of JP2012-158649A, or the like can also be used. In addition, as the dye, a colorant multimer may be used. Examples of the colorant multimer include the compounds described in JP2011-213925A and JP2013-041097A.

In a case where the coloring composition of the present invention includes other colorants, the mass ratio of C. I. Pigment Red 264 to other colorants, that is, C. I. Pigment Red 264:other colorants is preferably 55:45 to 75:25, and more preferably 60:40 to 70:30.

Furthermore, in a case where C. I. Pigment Yellow 139 is included as such other colorants, the mass ratio of C. I. Pigment Red 264 to C. I. Pigment Yellow 139, that is, C. I. Pigment Red 264:C.I. Pigment Yellow 139 is preferably 55:45 to 75:25, and more preferably 60:40 to 70:30.

For the coloring composition of the present invention the content of the colorant with respect to the total solid content in the coloring composition is preferably 10% to 80% by mass, and more preferably 10% to 60% by mass. The lower limit is more preferably 20% by mass or more, and still more preferably 30% by mass or more. If the content of the colorant is within the above-mentioned range, the content of components of other than the colorant can be increased, and the developability can be further improved.

<<Graft Resin Having Acid Group>>

The coloring composition of the present invention includes a graft resin having an acid group (hereinafter also referred to as an "acidic graft resin").

Since the acidic graft resin has an acid group, a function as a resin that imparts developability for pattern formation by alkali development can also be imparted. As a result, a cured film having a good pattern shape can be formed. Further, the acidic graft resin has affinity with a photopolymerizable compound and the like due to the presence of a graft chain, and the generation of residues after pattern formation can be suppressed. Incidentally, with the acidic graft resin, the dispersibility of colorants such as C. I. Pigment Red 264 is good, and a cured film having brightness unevenness suppressed can be formed. Incidentally, the dispersion stability of the composition can be improved, and the temporal change in viscosity can be decreased. In addition, the generation of the aggregates can be suppressed, and thus, when a cured film is formed, generation of defects caused by the aggregates can be suppressed.

In the present invention, the acidic graft resin can be preferably used as a dispersant. Further, the acidic graft resin may also be used in applications other than uses as the dispersant (for example, a binder).

In the present invention, the graft resin means a resin having a graft chain. Further, the graft chain represents a chain from the bottom of the main chain of a polymer to the terminal of a group branched from the main chain.

In the present invention, as the acidic graft resin, a resin having a graft chain having the number of atoms other than hydrogen atoms in a range of 40 to 10,000 is preferable.

Furthermore, the number of atoms other than hydrogen atoms per graft chain is preferably 40 to 10,000, more preferably 50 to 2,000, and still more preferably 60 to 500.

Examples of the main chain structure of the acidic graft resin include a (meth)acrylic resin, a polyester resin, a polyurethane resin, a polyurea resin, a polyamide resin, and a polyether resin. Among these, a (meth)acrylic resin is preferable.

As the graft chain of the acidic graft resin, a graft chain having a poly(meth)acryl, a polyester, or a polyether is preferable, and a graft chain having a polyester or a polyether is more preferable, in order to improve the mutual functionality between a graft moiety and a solvent, and thus increase the dispersibility.

As the macromonomer used in the production of an acidic graft resin by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; PLACCEL FM 5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by DAICEL CORPORATION; and a polyester-based macromonomer described in JP1990-272009A (JP-H02-272009A).

In the present invention, examples of the acid group contained in the acidic graft resin include a carboxyl group, a sulfonic acid group, and a phosphoric acid group, and from the viewpoint of the dispersibility, a carboxyl group is preferable.

In the present invention, the acid value of the acidic graft resin is preferably 5 to 150 mgKOH/g. The lower limit is more preferably 10 mgKOH/g or more, still more preferably 30 mgKOH/g or more, and even still more preferably 50 mgKOH/g or more. The upper limit is more preferably 120 mgKOH/g or less, and still more preferably 100 mgKOH/g or less.

In the present invention, the base value of the acidic graft resin is preferably 50 mgKOH/g or less, more preferably 30 mgKOH/g or less, and still more preferably 10 mgKOH/g or less. By setting the base value of the acidic graft resin to 50 mgKOH/g or less, excellent pattern forming properties are obtained. In addition, the generation of residues after pattern formation can be effectively suppressed.

In addition, in the present invention, the acid value indicates the numeral value in milligrams of potassium hydroxide required to neutralize acidic components per gram of the solid content. Incidentally, the base value indicates the numeral value in milligrams of potassium hydroxide (KOH) equivalent to the basic components per gram of the solid content.

In the present invention, the weight-average molecular weight (Mw) of the acidic graft resin is preferably 5,000 to 100,000, more preferably 10,000 to 50,000, and still more preferably 10,000 to 30,000.

The number-average molecular weight (Mn) of the acidic graft resin is preferably 2,500 to 50,000, more preferably 5,000 to 30,000, and still more preferably 5,000 to 15,000.

Furthermore, in the present invention, the weight-average molecular weight (Mw) and the number-average molecular weight (Mn) of the acidic graft resin are values in terms of polystyrene by gel permeation chromatography (GPC) measurement, and specifically, values measured by the method described in Examples which will be described later.

In the present invention, for the acidic graft resin, a copolymer including repeating units represented by any one of General Formula (A1) and General Formula (A2), and repeating units having an acid group is preferably used.

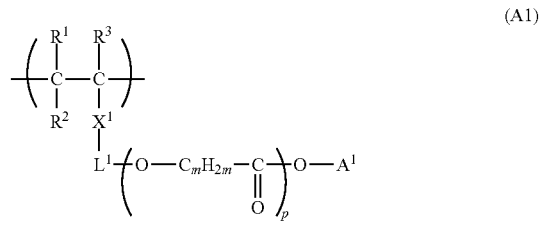

(A1)

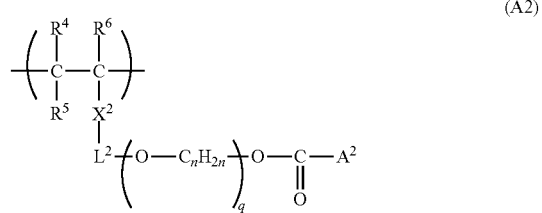

(A2)

In General Formulae (A1) and (A2), $R^1$ to $R^6$ each independently represent a hydrogen atom or a monovalent organic group, $X^1$ and $X^2$ each independently represent —CO—, —C(=O)O—, —CONH—, —OC(=O)—, or a phenylene group, $L^1$ and $L^2$ each independently represent a single bond or a divalent organic linking group, $A^1$ and $A^2$ each independently represent a monovalent organic group, m and n each independently an integer of 2 to 8, and p and q each independently represent an integer of 1 to 100.

$R^1$ to $R^6$ each independently represent a hydrogen atom or a monovalent organic group. As the monovalent organic group, a substituted or unsubstituted alkyl group is preferable. As the alkyl group, an alkyl group having 1 to 12 carbon atoms is preferable, an alkyl group having 1 to 8 carbon atoms is more preferable, and an alkyl group having 1 to 4 carbon atoms is particularly preferable.

As $R^1$, $R^2$, $R^4$, and $R^5$, a hydrogen atom is preferable, and as $R^3$ and $R^6$, a hydrogen atom or a methyl group is the most preferable from the viewpoint of adsorption efficiency on the pigment surface.

$X^1$ and $X^2$ each independently represent —CO—, —C(=O)O—, —CONH—, —OC(=O)—, or a phenylene group, and among those, —C(=O)O—, —CONH—, and a phenylene group are preferable from the viewpoint of adsorption efficiency on the pigment, and —C(=O)O— is the most preferable.

$L^1$ and $L^2$ each independently represent a single bond or a divalent organic linking group. As the divalent organic linking group, a divalent organic linking group including a substituted or unsubstituted alkylene group, an alkylene group and a heteroatom, or a heteroatom-containing partial structure is preferable.

As the alkylene group, an alkylene group having 1 to 12 carbon atoms is preferable, an alkylene group having 1 to 8 carbon atoms is more preferable, and an alkylene group having 1 to 4 carbon atoms is particularly preferable.

Examples of the heteroatom in the heteroatom-containing partial structure include an oxygen atom, a nitrogen atom, and a sulfur atom, and among those, an oxygen atom and a nitrogen atom are preferable.

As the divalent organic linking group, a group which has a heteroatom or a heteroatom-containing partial structure, selected from —C(=O)—, —OC(=O)—, and —NHC(=O)—, at the terminal of the alkylene group, and are linked to an adjacent oxygen atom via the heteroatom or the heteroatom-containing partial structure is preferable from the viewpoint of adsorptivity onto the pigment. Here, the adjacent oxygen atom means an oxygen atom which is bonded at the terminal side of the side chain, with respect to $L^1$ in General Formula (A1) and $L^2$ in General Formula (A2).

$A^1$ and $A^2$ each independently represent a monovalent organic group. As the monovalent organic group, a substituted or unsubstituted alkyl group, or a substituted or unsubstituted aryl group is preferable. Examples of the substituent include the substituents described in paragraph No. 0028 in JP2009-256572A, the contents of which are incorporated herein.

From the viewpoints of dispersion stability and developability, as $A^1$ and $A^2$, a linear alkyl group having 1 to 20 carbon atoms, a branched alkyl group having 3 to 20 carbon atoms, and a cyclic alkyl group having 5 to 20 carbon atoms are preferable, and a linear alkyl group having 4 to 15 carbon atoms, a branched alkyl group having 4 to 15 carbon atoms, and a cyclic alkyl group having 6 to 10 carbon atoms are more preferable, and a linear alkyl group having 6 to 10 carbon atoms and a branched alkyl group having 6 to 12 carbon atoms are still more preferable.

m and n each independently represent an integer of 2 to 8. From the viewpoints of dispersion stability and developability, m and n are preferably 4 to 6, and the most preferably 5.

p and q each independently represent an integer of 1 to 100. Two or more kinds of p's which are different from each other and q's which are different from each other may be mixed. From the viewpoints of dispersion stability and developability, p and q are preferably 5 to 60, more preferably 5 to 40, and still more preferably 5 to 20.

With regard to the details of the repeating unit represented by General Formula (A1) and the repeating unit represented by General Formula (A2), reference can be made to the descriptions in paragraph Nos. 0034 to 0044 of JP2009-256572A, the contents of which are incorporated herein.

The repeating unit having an acid group can be configured with a monomer having an acid group. Examples of the monomer having an acid group include a vinyl monomer having a carboxyl group, a vinyl monomer having a sulfonic acid group, and a monomer having a phosphoric acid group.

Examples of the vinyl monomer having a carboxyl group include (meth)acrylic acid, vinyl benzoic acid, maleic acid, monoalkyl maleic ester, fumaric acid, itaconic acid, crotonic acid, cinnamic acid, and an acrylic acid dimer. Further, an addition reaction products of a monomer having a hydroxyl group, such as 2-hydroxyethyl (meth)acrylate, with a cyclic anhydride such as maleic anhydride, phthalic anhydride, succinic anhydride, and cyclohexane dicarboxylic anhydride; ω-carboxy-polycaprolactone mono(meth)acrylate; or the like can also be used. Incidentally, as a precursor of a carboxyl group, an anhydride-containing monomer such as maleic anhydride, itaconic anhydride, and citraconic anhydride may also be used. Among these, from the viewpoint of the properties of removing unexposed areas by development, addition reaction products of a monomer having a hydroxyl group, such as 2-hydroxyethyl (meth)acrylate, with a cyclic anhydride such as maleic anhydride, phthalic anhydride, succinic anhydride, and cyclohexane dicarboxylic anhydride are preferable.

Examples of the vinyl monomer having a sulfonic acid group include 2-acrylamide-2-methylpropanesulfonic acid.

Examples of the vinyl monomer having a phosphoric acid group include mono(2-acryloyloxyethyl)phosphate and mono(1-methyl-2-acryloyloxyethyl)phosphate.

Furthermore, with regard to the repeating unit having an acid group, reference can be made to the descriptions in paragraph Nos. 0067 to 0069 in JP2008-165059A, the contents of which are incorporated herein.

With regard to the acidic graft resin, reference can be made to the descriptions in paragraph Nos. 0021 to 0088 in JP2009-256572A, the contents of which are incorporated herein.

Furthermore, in the present invention, as the acidic graft resin, an oligoimine-based graft resin containing a nitrogen atom in at least one of the main chain and the side chain can be used.

As the oligoimine-based graft resin used in the present invention, a resin which has a side chain including a repeating unit having a partial structure X having a functional group with a $pK_a$ of 14 or less as an acid group, and an oligomer chain or polymer chain Y having 40 to 10,000 atoms, and contains a basic nitrogen atom in at least one of the main chain and the side chain is preferable.

Here, the basic nitrogen atom is not particularly limited as long as it is a nitrogen atom exhibiting basicity. The oligoimine-based graft resin preferably contains a structure having a nitrogen atom with a base strength $pK_b$ of 14 or less, and more preferably contains a structure having a nitrogen atom with a $pK_b$ of 10 or less.

In the present invention, the basic strength $pK_b$ refers to a $pK_b$ at a water temperature of 25° C., is one of the indices to quantitatively represent the intensity of a base, and is the same as the basicity constant. The basic strength $pK_b$ and an acid strength $pK_a$ which will be described later have a relationship of $pK_b = 14 - pK_a$.

It is particularly preferable that the oligoimine-based graft resin has a repeating unit (i) which is at least one repeating unit having a basic nitrogen atom, selected from a poly (lower alkylenimine)-based repeating unit, a polyallylamine-based repeating unit, a polydiallylamine-based repeating unit, a methaxylenediamine-epichlorohydrin polycondensate-based repeating unit, and a polyvinylamine-based repeating unit, and has a partial structure X having a functional group with a $pK_a$ of 14 or less while being bonded to the basic nitrogen atom, and a side chain (ii) including an oligomer chain or polymer chain Y having 40 to 10,000 atoms.

Examples of the oligoimine-based graft resin include a resin including a repeating unit represented by the following General Formula (I-1) and a repeating unit represented by the following General Formula (I-2).

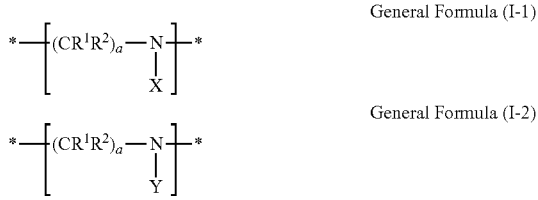

General Formula (I-1)

General Formula (I-2)

In General Formulae (I-1) and (I-2), $R^1$ and $R^2$ each independently represent a hydrogen atom, a halogen atom, or an alkyl group, a's each independently represent an integer of 1 to 5, * represents a linking moiety with between the repeating units, X represents a group having a functional group with a $pK_a$ of 14 or less, and Y represents an oligomer chain or polymer chain having 40 to 10,000 atoms.

The oligoimine-based graft resin preferably further includes a repeating unit represented by General Formula (I-3). According to this aspect, the dispersion performance of a colorant and the like is more improved.

General Formula (I-3)

In General Formula (I-3), $R^1$, $R^2$, and a have the same definitions as $R^1$, $R^2$, and a in General Formula (I-1). Y' represents an oligomer chain or polymer chain having 40 to 10,000 atoms, containing an anion group. The repeating unit represented by General Formula (I-3) can be formed by causing a reaction by adding an oligomer or polymer having a group forming a salt by reacting with an amine to a resin having a primary or secondary amino group in the main chain moiety.

In General Formulae (I-1), (I-2), and (I-3), $R^1$ and $R^2$ are preferably a hydrogen atom. a is preferably 2 from the viewpoint of the availability of raw materials.

The oligoimine-based graft resin may include a lower alkylenimine which contains a primary or tertiary amino group as a repeating unit, in addition to the repeating units represented by General Formulae (I-1), (I-2), and (I-3). Further, a group represented by X, Y, or Y' may be bonded to a nitrogen atom in the lower alkylenimine repeating unit.

The repeating unit represented by General Formula (I-1) is contained in the proportion of preferably 1% to 80% by mole, and the most preferably 3% to 50% by mole, in all the repeating units included in the oligoimine-based graft resin.

The repeating unit represented by General Formula (I-2) is contained in the proportion of preferably 10% to 90% by mole, and the most preferably 30% to 70% by mole, in all the repeating units included in the oligoimine-based graft resin.

From the viewpoint of the dispersion stability, and a balance between the hydrophobicity and the hydrophilicity, the content ratio [(I-1):(I-2)] of the repeating unit represented by Formula (I-1) and the repeating unit represented by Formula (I-2) is preferably in a range of 10:1 to 1:100, and more preferably in a range of 1:1 to 1:10, in terms of a molar ratio.

Furthermore, the repeating unit represented by General Formula (I-3), which is used in combination as desired, is a repeating unit in which a partial structure including an oligomer chain or polymer chain Y' having 40 to 10,000 atoms is ionically bonded to a nitrogen atom in the main chain, and from the viewpoint of the effect, the repeating unit is preferably contained in the proportion of 0.5% to 20% by mole, and the most preferably contained in the proportion of 1% to 10% by mole, in all the repeating units included in the oligoimine-based graft resin. Further, it is possible to confirm that the polymer chain Y' is ionically bonded by means of infrared spectroscopy or base titration.

For the oligoimine-based graft resin, the compounds described in paragraph Nos. 0016 to 0018 of JP2009-258668A and paragraph Nos. 0021 to 0080 of JP2009-203462A, the contents of which are incorporated herein, can also be used.

<<Other Resins>>

The coloring composition of the present invention can further include resins other than the above-mentioned acidic graft resins (hereinafter also referred to as "other resins"). Examples of such other resins include resins (linear organic high-molecular-weight polymers) having no graft chain, and graft resins having no acid group. The resin having no graft chain may be either a resin having an acid group or a resin not having an acid group.

An example of such other resins may include an alkali-soluble resin. By incorporating the alkali-soluble resin, the developability/pattern forming properties are improved. Further, the alkali-soluble resin can be used as a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high-molecular-weight polymer, and can be appropriately selected from alkali-soluble resins having at least one group enhancing alkali solubility in a molecule (preferably a molecule having an acryl-based copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali-solubility (hereinafter also referred to as an "acid group") include a carboxyl group, a phosphoric acid group, a sulfonic acid group, and a phenolic hydroxyl group. The group enhancing alkali-solubility is preferably a group which is soluble in an organic solvent and can be developed by an aqueous weak alkaline solution, and particularly preferred examples thereof include (meth)acrylic acid. These acid groups may be used singly or in combination of two or more kinds thereof.

In order to produce the alkali-soluble resin, for example, a method using known radical polymerization can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Other monomers copolymerizable with a (meth)acrylic acid may be used singly or in combination of two or more kinds thereof Moreover, in order to improve the crosslinking efficiency of the coloring composition in the present invention, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful.

As the alkali-soluble resin containing a polymerizable group, an alkali-soluble resin modified with urethane, which is obtained by reacting an isocyanate group with an hydroxyl group in advance to leave an unreacted isocyanate group and performing a reaction between a compound having a polymerizable group such as a (meth)acryloyl group and an acrylic resin having a carboxyl group; an alkali-soluble resin which is obtained by reacting an acrylic resin having a carboxyl group with a compound having both an epoxy group and a polymerizable double bond in a molecule; an acid pendant type epoxy acrylate resin; an alkali-soluble resin obtained by reacting an acrylic resin having an hydroxyl group with a dibasic acid anhydride having a polymerizable double bond; an alkali-soluble resin obtained by reacting an acrylic resin having a hydroxyl group with a compound having isocyanate and a polymerizable group; an alkali-soluble resin obtained by treating a resin which has an ester group having an elimination group such as a halogen atom or a sulfonate group in an α- or β-position described in JP2002-229207A and JP2003-335814A on a side chain with a base; and the like are preferable.

Examples of the alkali-soluble resin containing a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), and ACRYCURE RD-F8 (manufactured by Nippon Shokubai Co., Ltd).

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used.

It is also preferable that the alkali-soluble resin includes a polymer (a) obtained by polymerizing monomer components including a compound (hereinafter also referred to as an "ether dimer" in some cases) represented by the following General Formula (ED1) and/or a compound represented by the following General Formula (ED2).

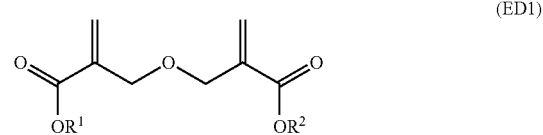

(ED1)

In General Formula (ED1), $R^1$ and $R^2$ each independently represent a hydrogen atom or a hydrocarbon group having 1 to 25 carbon atoms, which may have a substituent.

(ED2)

In General Formula (ED2), R represents a hydrogen atom or an organic group having 1 to 30 carbon atoms. With regard to the specific examples of General Formula (ED2), reference can be made to the descriptions in JP2010-168539A.

In General Formula (ED1), the hydrocarbon group having 1 to 25 carbon atoms, represented by $R^1$ and $R^2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy, such as 1-methoxyethyl and 1-ethoxyethyl; and alkyl groups substituted with an aryl group, such as benzyl. Among these, from the viewpoint of heat resistance, substituents of primary or secondary carbon, which are not easily eliminated by an acid or heat, such as methyl, ethyl, cyclohexyl, and benzyl, are particularly preferable.

Specific examples of the ether dimer include those described in paragraph 0317 of JP2013-29760A, the contents of which are incorporated herein. These ether dimers may be used singly or in combination of two or more kinds thereof. The structure derived from the compound represented by General Formula (ED) may be copolymerized with other monomers.

The alkali-soluble resin may include a structural unit derived from a compound represented by the following Formula (X).

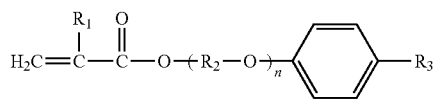

In Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may contain a benzene ring, and n represents an integer of 1 to 15.

In Formula (X), the number of carbon atoms of the alkylene group of $R^2$ is preferably 2 or 3. Further, the number of carbon atoms of the alkyl group of $R^3$ is 1 to 20, and more preferably 1 to 10, and the alkyl group of $R^3$ may contain a benzene ring. Examples of the alkyl group containing a benzene ring, represented by $R^3$, include a benzyl group and a 2-phenyl(iso)propyl group.

With regard to the alkali-soluble resin, reference can be made to the descriptions in paragraphs 0558 to 0571 of JP2012-208494A (<0685> to <0700> of the corresponding US2012/0235099A), the contents of which are incorporated herein.

Moreover, it is preferable to use the copolymers (B) described in paragraph Nos. 0029 to 0063 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and even still more preferably 120 mgKOH/g or less.

In a case where the coloring composition contains the alkali-soluble resin, the content of the alkali-soluble resin is preferably 1% to 15% by mass, more preferably 2% to 12% by mass, and still more preferably 3% to 10% by mass, with respect to the total solid contents of the coloring composition. The coloring composition of the present invention may include one kind or two or more kinds of the alkali-soluble resin. In a case where the coloring composition includes two or more kinds of the alkali-soluble resin, a total amount thereof preferably falls within the range.

<<Photopolymerizable Compound>>

The coloring composition of the present invention includes a photopolymerizable compound (hereinafter also referred to as a "polymerizable compound"). As the polymerizable compound, known compounds can be used, and examples thereof include compounds having a group having an ethylenically unsaturated bond, a cyclic ether (epoxy or oxetane) group, a methylol group, or the like. Examples of the group having an ethylenically unsaturated bond include a vinyl group, a (meth)allyl group, and a (meth)acryloyl group. In the present invention, the polymerizable compound is preferably a radically polymerizable compound.

The polymerizable compound may be any chemical form of, for example, a monomer, a prepolymer, that is, a dimer, a trimer, and an oligomer, or a mixture thereof and a multimer thereof, and the like.

The polymerizable compound is preferably a trifunctional to pentakaidecafunctional (meth)acrylate compound, and more preferably a trifunctional to hexafunctional (meth)acrylate compound.

Examples of the monomer and the prepolymer, unsaturated carboxylic acids (for example, acrylic acid, methacrylic acid, itaconic acid, crotonic acid, isocrotonic acid, and maleic acid) or esters thereof, amides thereof, and multimers thereof may be included and preferably, esters of unsaturated carboxylic acids and aliphatic polyhydric alcohol compounds and amides of unsaturated carboxylic acids and an aliphatic multivalent amine compounds and multimers thereof are included. Further, addition reaction products of unsaturated carboxylates or amides having nucleophilic substituents such as a hydroxyl group, an amino group, a mercapto group or the like and monofunctional or polyfunctional isocyanates or epoxies, or dehydration condensation reaction products with monofunctional or polyfunctional carboxylic acids or the like are suitably used. In addition, reaction products of unsaturated carboxylates or amides having electrophilic substituents such as an isocyanate group or an epoxy group or the like and monofunctional or polyfunctional alcohols, amines or thiols, or reaction products of unsaturated carboxylates or amides having dissociating substituents such as a halogen group or a tosyloxy group and monofunctional or polyfunctional alcohols, amines or thiols are also suitably used. In addition, as other examples, a compound group substituted with a vinyl benzene derivative such as unsaturated phosphonic acid and styrene, vinyl ether, allyl ether, or the like instead of the unsaturated carboxylic acids can also be used.

As the specific examples of these compounds, the compounds described in paragraph Nos. [0095] to [0108] of JP2009-288705A can also be suitably used in the present invention.

In the present invention, as the polymerizable compound, a compound having a boiling point of 100° C. or higher under normal pressure, which has one or more groups having an ethylenically unsaturated bond, are also preferable. As for examples thereof, reference can be made to the compounds described in paragraph 0227 of JP2013-29760A and the compounds described in paragraph Nos. 0254 to 0257 of JP2008-292970A, the contents of which are incorporated herein.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), a structure (for example, SR454 and SR499, commercially available from Sartomer Company, Inc) in which an ethylene glycol or propylene glycol residue is interposed between these (meth)acryloyl groups is preferable. Oligomer types of these can also be used. In addition, NK ESTER A-TMMT (pentaerythritol tetraacrylate, manufactured by Shin-Nakamura Chemical Co., Ltd.), KAYARAD RP-1040 (manufactured by Nippon Kayaku Co., Ltd.), or the like can also be used.

Preferred aspects of the polymerizable compound will be shown below.

The polymerizable compound may have an acid group such as a carboxyl group, a sulfonic acid group, and a phosphoric acid group. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably, in this ester, the aliphatic polyhydroxy compound is pentaerythritol and/or dipentaerythritol. Examples of the commercial product thereof include ARONIX TO-2349, M-305, M-510, and M-520, manufactured by Toagosei Co., Ltd.

The acid value of the polymerizable compound having an acid group is preferably 0.1 to 40 mgKOH/g, and particularly preferably 5 to 30 mgKOH/g. If the acid value of the polymerizable compound is 0.1 mgKOH/g or more, the developing characteristics are good, whereas the acid value is 40 mgKOH/g or less, it is advantageous in production or handling. In addition, the photopolymerization performance is good and the curability is excellent.

Moreover, it is also a preferred aspect that the compound has a caprolactone structure.

The compound having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a compound having a caprolactone structure represented by the following General Formula (Z-1) is preferable.

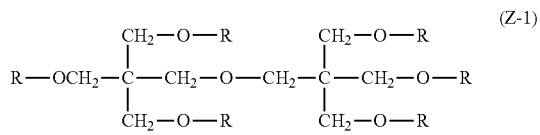

In General Formula (Z-1), all of six R's are a group represented by the following General Formula (Z-2). Alternatively, one to five out of six R's are a group represented by the following General Formula (Z-2), and the remainder is a group represented by the following General Formula (Z-3).

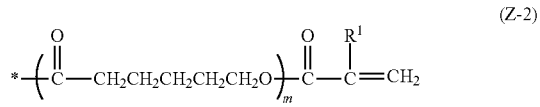

In General Formula (Z-2), $R^1$ represents a hydrogen atom or a methyl group, m represents a number 1 or 2, and "*" represents a bonding hand.

In General Formula (Z-3), $R^1$ represents a hydrogen atom or a methyl group, and "*" represents a bonding hand.

The polymerizable compound having a caprolactone structure is commercially available from Nippon Kayaku Co., Ltd., as a KAYARAD DPCA series, and examples thereof include DPCA-20 (a compound in which m is 1, the number of R's which are the groups represented by Formula (Z-2) out of six R's is 2, and all of $R^1$'s are hydrogen atoms in Formulae (Z-1) to (Z-3)), DPCA-30 (a compound in which m is 1, the number of R's which are the groups represented by Formula (Z-2) out of six R's is 3, and all of $R^1$'s are hydrogen atoms in Formulae (Z-1) to (Z-3)), DPCA-60 (a compound in which m is 1, the number of R's which are the groups represented by Formula (Z-2) out of six R's is 6, and all of $R^1$'s are hydrogen atoms in Formulae (Z-1) to (Z-3)), and DPCA-120 (a compound in which m is 2, the number of R's which are the groups represented by Formula (Z-2) out of six R's is 6, and all of $R^1$'s are hydrogen atoms in Formulae (Z-1) to (Z-3)).

Moreover, for the polymerizable compound, a compound represented by the following General Formula (Z-4) or (Z-5) can be used.

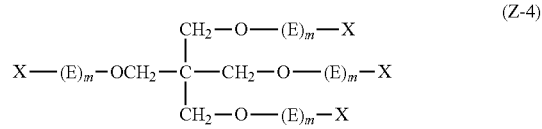

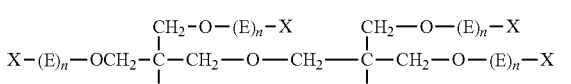

In General Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In General Formula (Z-4), the sum of the (meth)acryloyl groups is 3 or 4, m's each independently represent an integer of 0 to 10, and the sum of the respective m's is an integer of 0 to 40.

In General Formula (Z-5), the sum of the (meth)acryloyl groups is 5 or 6, n's each independently represent an integer of 0 to 10, and the sum of the respective n's is an integer of 0 to 60.

In General Formula (Z-4), m is preferably an integer of 0 to 6, and more preferably an integer of 0 to 4.

Furthermore, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —((CH$_2$)$_y$CH$_2$O)— or —((CH$_2$)$_y$ CH(CH$_3$)O)— in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are acryloyl groups is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by known method, which includes binding ethylene oxide or propylene oxide to pentaerythritol or dipentaerythritol by a ring-opening addition reaction to form a ring-opening skeleton, and reacting, for example, (meth)acryloyl chloride to a terminal hydroxyl group of the ring-opening skeleton to introduce a (meth)acryloyl group. Since the method is well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable. Specific examples of the compounds include compounds represented by the following Formulae (a) to (f) (hereinafter also referred to as "exemplary compounds (a) to (f)"). Among these, the exemplary compounds (a), (b), (e), and (f) are preferable.

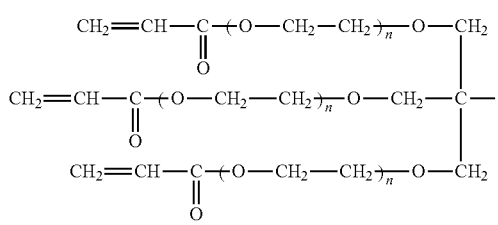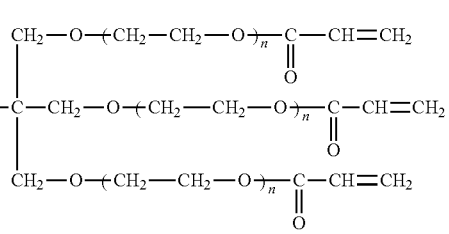

(a)

(the sum of the respective n's is 6)

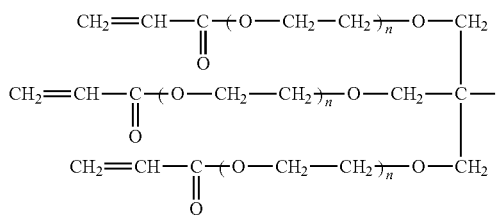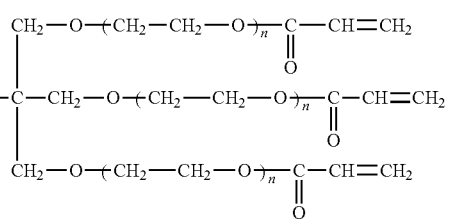

(b)

(the sum of the respective n's is 12)

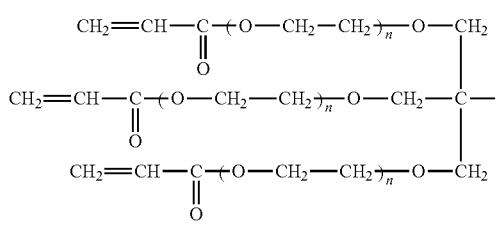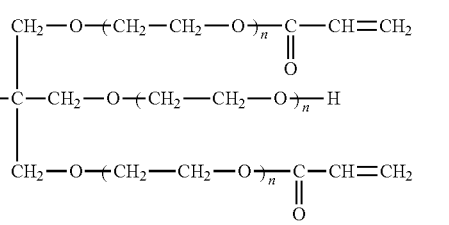

(c)

(the sum of the respective n's is 12)

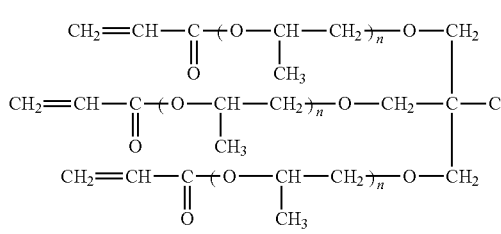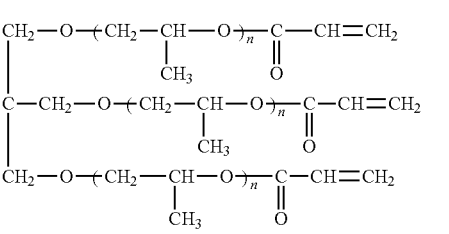

(d)

(the sum of the respective n's is 6)

-continued

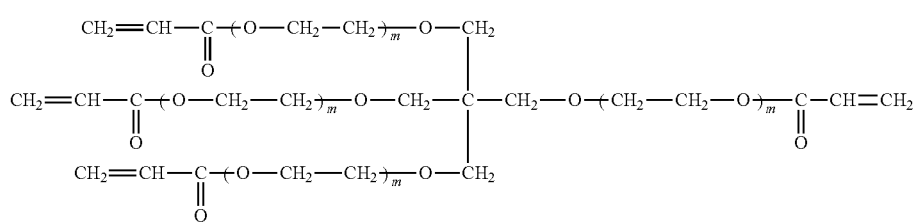

(the sum of the respective m's is 4)

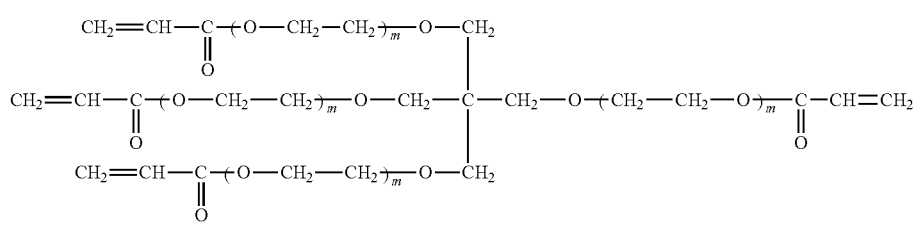

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

Moreover, as polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, by using addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), as the polymerizable compounds, a coloring composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

The content of the polymerizable compound in the coloring composition of the present invention is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The polymerizable compound may be used singly or in combination of two or more kinds thereof. In a case where the polymerizable compound is used in combination of two or more kinds thereof, the total amount thereof preferably falls within the range.

<<Curing Accelerator>>

A curing accelerator may be added to the coloring composition of the present invention for the purpose of, for example, promoting the reaction of the polymerizable compound. Examples of the curing accelerator include polyfunctional thiol compounds having two or more mercapto groups in a molecule thereof. The polyfunctional thiol compounds are preferably secondary alkanethiols, and particularly preferably compounds having structures represented by the following General Formula (T1).

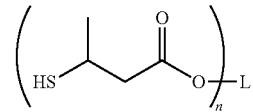

General Formula (T1)

(In Formula (T1), n represents an integer of 2 to 4, and L represents a divalent to tetravalent linking group.)

In General Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compound are compounds represented by the following Structural Formulae (T2) to (T4), and a compound represented by General Formula (T2) is particularly preferable. These polyfunctional thiols can be used singly or in combination of two or more kinds thereof.

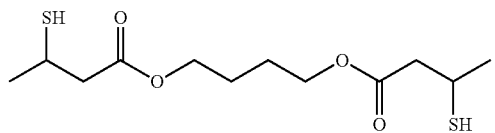

(T2)

-continued

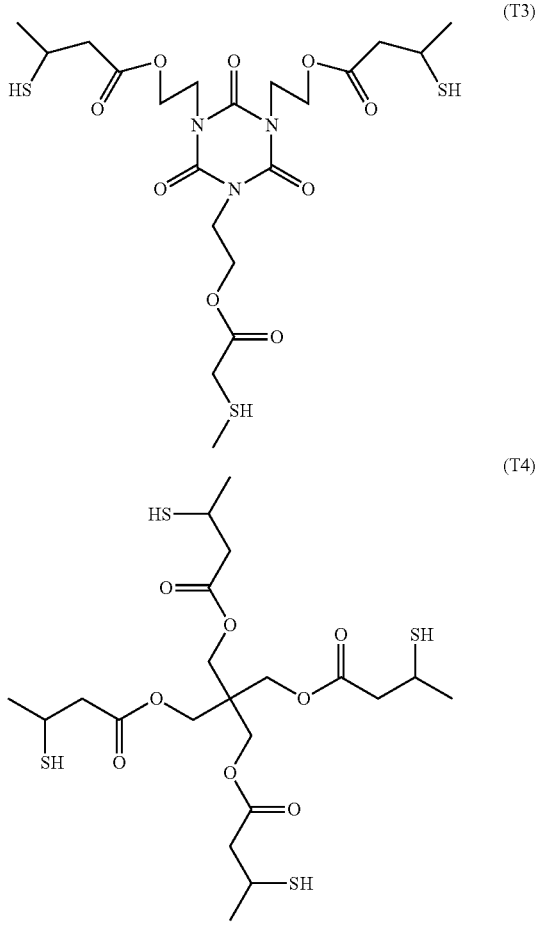

(T3)

(T4)

In a case where the coloring composition of the present invention contains the polyfunctional thiol, the content of the polyfunctional thiol is preferably 0.3% to 8.9% by mass, and more preferably 0.8% to 6.4% by mass, with respect to the total solid content of the coloring composition. In addition, the polyfunctional thiol may be added for the purpose of improving stability, odor, resolution, developability, adhesiveness, and the like.

Moreover, the curing accelerator can also use a methylol-based compound (for example, the compounds exemplified as a crosslinking agent in paragraph 0246 of JP2015-34963A), amines, phosphonium salts, amidine salts, amide compounds (all, the curing agents described in, for example, paragraph 0186 of JP2013-41165A), base generators (for example, the ionic compounds described in JP2014-55114A), cyanate compounds (for example, the compounds described in paragraph 0071 of JP2012-150180A), alkoxysilane compounds (for example, the alkoxysilane compounds having epoxy groups, described in JP2011-253054A), onium salt compounds (for example, the compounds exemplified as an acid generator in paragraph 0216 of JP2015-34963A, and the compounds described in JP2009-180949A), or the like.

In a case where the coloring composition of the present invention contains a curing accelerator, the content of the curing accelerator is preferably 0.3% to 8.9% by mass, and more preferably 0.8% to 6.4% by mass, with respect to the total solid content of the coloring composition.

<<Photopolymerization Initiator>>

The coloring composition of the present invention contains a photopolymerization initiator.

The photopolymerization initiator is not particularly limited as long as it has the ability to initiate the polymerization of polymerizable compounds, and can be appropriately selected from known photopolymerization initiators. For example, it is preferably sensitive to radiations from UV to visible regions. Further, it may be an activator that causes some actions with a photoexcited sensitizer to generate active radicals or an initiator that functions to initiate cationic polymerization depending on the type of the monomer.

Furthermore, the photopolymerization initiator preferably contains at least one compound having a molar light absorption coefficient of at least about 50 in the range of about 300 nm to 800 nm (more preferably 330 nm to 500 nm).

Examples of the photopolymerization initiator include halogenated hydrocarbon derivatives (for example, those having a triazine skeleton and those having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Moreover, from the viewpoint of the exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable.

At least one compound selected from the group consisting of a trihalomethyltriazine compound, an α-aminoketone compound, an acylphosphine compound, a phosphine oxide compound, an oxime compound, a triallylimidazole dimer, an onium compound, a benzophenone compound, and an acetophenone compound is more preferable, and at least one compound selected from the group consisting of a trihalomethyltriazine compound, an α-aminoketone compound, an oxime compound, a triallylimidazole dimer, and a benzophenone compound is particularly preferable.

In particular, when the coloring composition of the present invention is used to manufacture a color filter for a solid-state imaging element, it is important that it should be not only readily curable but also developable without leaving residues in unexposed areas since it is necessary to form micropatterns in sharp shapes. From such a viewpoint, it is particularly preferable to use an oxime compound as a photopolymerization initiator. In particular, when micropatterns are formed in a solid-state imaging element, a stepper exposure device (exposure machine) is used for curing exposure, but such a exposure machine may be damaged by halogen, and thus, it is necessary to reduce the addition amount of the photopolymerization initiator. Thus, taking into consideration these points, it is particularly preferable to use the oxime compound as the photopolymerization initiator for forming micropatterns as in a solid-state imaging element or the like. In addition, by using the oxime compound, color transfer properties can be further improved.

For specific examples of the photopolymerization initiator, reference can be made to, for example, paragraphs 0265 to 0268 of JP2013-29760A, the contents of which are incorporated herein.

As the photopolymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A), and the acylphosphine-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used.

As the aminoacetophenone-based initiator, IRGACURE-907, IRGACURE-369, and IRGACURE-379EG (trade names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used.

As the acylphosphine-based initiator, IRGACURE-819 or DAROCUR-TPO (trade names, all manufactured by BASF) which are commercially available products can be used.

More preferred examples of the photopolymerization initiator include oxime compounds.

As the specific examples of the oxime compound, the compound described in JP2001-233842A, the compound described in JP2000-80068A, and the compound described in JP2006-342166A can be used.

In the present invention, examples of the oxime compound which can be suitably used include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Other examples of the oxime compound include the compounds described in J. C. S. Perkin II (1979), pp. 1653-1660, J. C. S. Perkin II (1979), pp. 156-162, Journal of Photopolymer Science and Technology (1995), pp. 202-232, and JP2000-66385A, and the compounds described in each of JP2000-80068A, JP2004-534797A, and JP2006-342166A.

As commercially available products, IRGACURE-OXE01 (manufactured by BASF) and IRGACURE-OXE02 (manufactured by BASF) are also suitably used. Further, TR-PBG-304 (manufactured by CHANGZHOU TRONLY NEW ELECTRONIC MATERIALS CO., LTD.), and ADEKA ARKLS NCI-831 and ADEKA ARKLS NCI-930 (manufactured by ADEKA) can also be used.

Moreover, as the oxime compounds other than those described above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compound described in WO2009/131189A, the compound described in U.S. Pat. No. 7,556,910B that contains a triazine skeleton and an oxime skeleton in the same molecule, the compound described in JP2009-221114A that exhibits maximum absorption at 405 nm and exhibits excellent sensitivity to a light source of a g-line, and the like may be used.

Preferably, reference can be made to the descriptions in, for example, paragraphs 0274 and 0275 of JP2013-29760A, the contents of which are incorporated herein.

Specifically, as the oxime compound, a compound represented by the following General Formula (OX-1) is preferable. Moreover, the compound may be an oxime compound in which an N—O bond of oxime forms an (E) isomer, an oxime compound in which the N—O bond forms a (Z) isomer, or a mixture in which the N—O bond forms a mixture of the (E) isomer and the (Z) isomer.

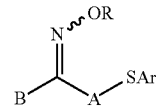

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Moreover, the above substituents may be further substituted with other substituents.

Examples of the substituents include a halogen atom, an aryloxy group, an alkoxycarbonyl group, an aryloxycarbonyl group, an acyloxy group, an acyl group, an alkyl group, and an aryl group.

In General Formula (OX-1), the monovalent substituent represented by B is preferably an aryl group, a heterocyclic group, an arylcarbonyl group, or a heterocyclic carbonyl group. These groups may have one or more substituents, and examples of the substituents include the substituents described above.

In General Formula (OX-1), the divalent organic group represented by A is preferably an alkylene group having 1 to 12 carbon atoms, a cycloalkylene group, or an alkynylene group. These groups may have one or more substituents. Examples of the substituents include the substituents described above.

Specific examples of the compound represented by General Formula (OX-1) are shown below, but the present invention is not limited thereto.

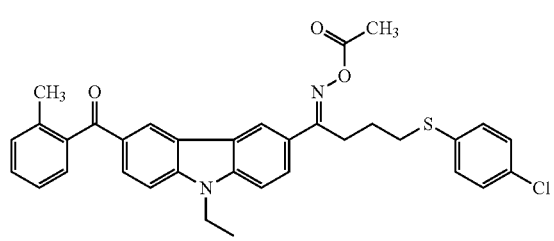

(C-4)

(C-5)
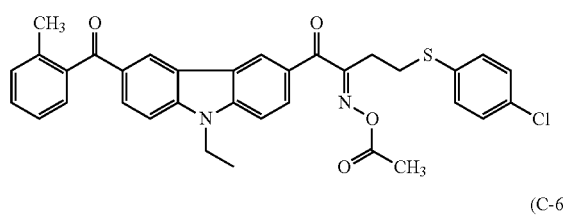

(C-6)
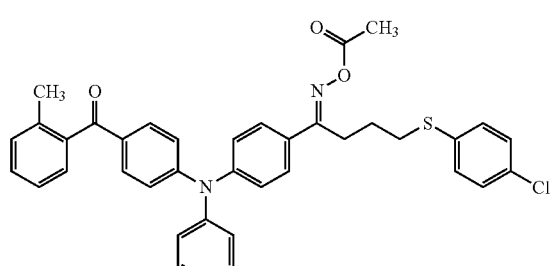

(C-7)
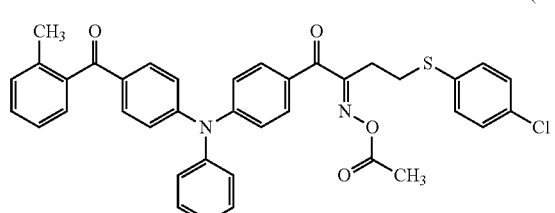

(C-8)
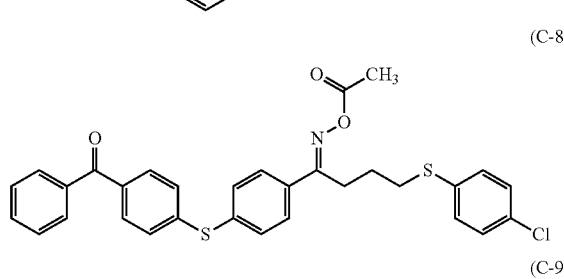

(C-9)
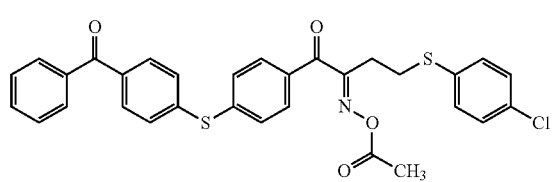

(C-10)
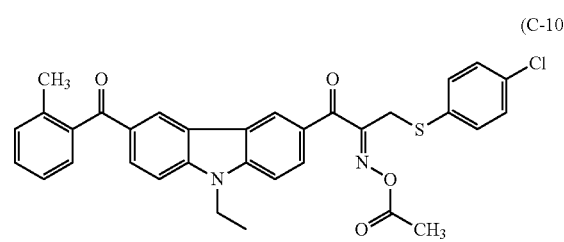

(C-11)
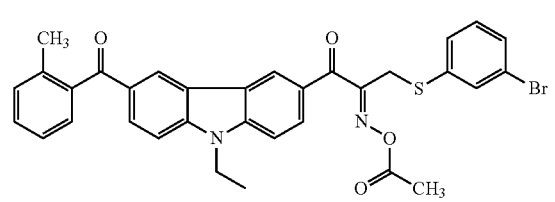

(C-12)
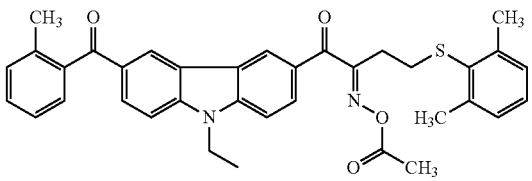

(C-13)
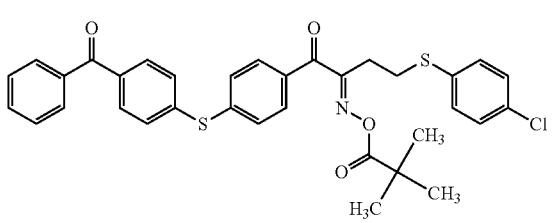

(C-14)
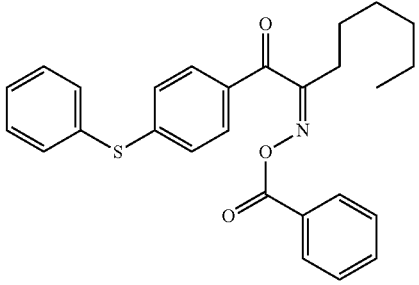

(C-15)
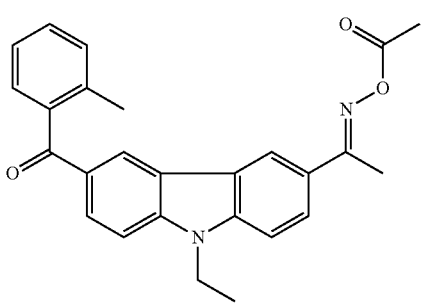

In the present invention, an oxime compound having a fluorine atom can be preferably used as the photopolymerization initiator. Specific examples of the oxime compound having a fluorine atom include the following compounds. Further, the compounds described in JP2010-262028A, the compounds 24, and 36 to 40 described in JP2014-500852A, and the compound (C-3) described in JP2013-164471A, the contents of which are incorporated herein.

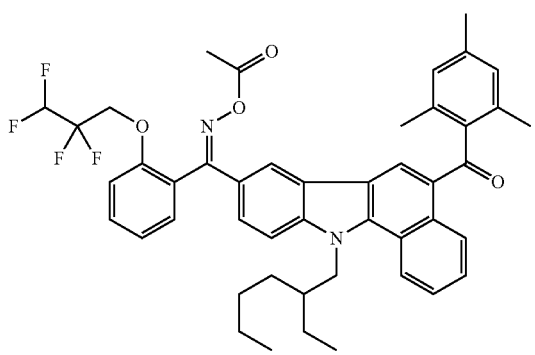 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

In the present invention, an oxime compound having a nitro group can be preferably used as the photopolymerization initiator. Specific examples of the oxime compound having a nitro group include the compounds described in paragraphs 0031 to 0047 of JP2013-114249A, paragraphs 0008 to 0012 and 0070 to 0079 of JP2014-137466A, and ADEKA ARKLS NCI-831 (manufactured by ADEKA).

The oxime compound preferably has a maximum absorption wavelength in a wavelength range of 350 nm to 500 nm, and more preferably in a wavelength range of 360 nm to 480 nm, and an oxime compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, and more preferably 2,000 to 300,000, and particularly preferably 5,000 to 200,000.

The molar light absorption coefficient of the compound can be measured using a known method, and it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

If desired, the photopolymerization initiator used in the present invention may be used in combination of two or more kinds thereof.

In the present invention, a compound represented by the following General Formula (1) or (2) can also be used photopolymerization initiator.

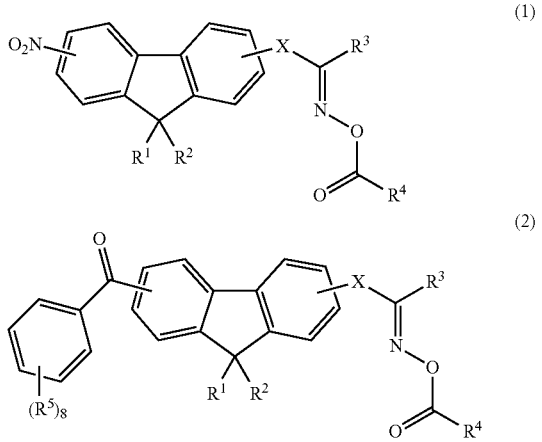

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, in a case where $R^1$ and $R^2$ are phenyl groups, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 4.

In Formulae (1) and (2), $R^1$ and $R^2$ are each independently preferably a methyl group, an ethyl group, an n-propyl group, i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formulae (1) and (2) include the compounds described in paragraph Nos. 0076 to 0079 of JP2014-137466A, the contents of which are incorporated herein.

Furthermore, in the present invention, the oxime compounds described in paragraph Nos. 0005 to 0120 of JP2014-500852A as the photopolymerization initiator.

The content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained.

The coloring composition of the present invention may include one kind or two or more kinds of the photopolymerization initiators. In a case where the coloring composition includes two or more kinds of the photopolymerization initiators, the total amount thereof preferably falls within the range.

<<Pigment Derivative>>

The coloring composition of the present invention preferably contains a pigment derivative. The pigment derivative is preferably a compound has a structure in which a portion of an organic pigment is substituted with an acidic group, a basic group, or a phthalimidomethyl group. From the viewpoint of the dispersibility and the dispersion stability of the pigment, a pigment derivative having an acidic group or a basic group is preferable, and a pigment derivative having a basic group is particularly preferable.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment.

In addition, the acidic group contained in the pigment derivative is preferably a sulfonic acid group, a carboxylic acid group, or a salt thereof, more preferably a carboxylic acid group or a sulfonic acid group, and particularly preferably a sulfonic acid group. The basic group contained in the pigment derivative is preferably an amino group and particularly preferably a tertiary amino group.

As the pigment derivative, particularly quinoline-based, benzimidazolone-based, and isoindoline-based pigment derivatives are preferable, and quinoline-based and benzimidazolone-based pigment derivatives are more preferable. In particular, the pigment derivative having the following structure is preferable.

In General Formula (P), A represents the following General Formula (PA-1) or (PA-2), B represents a single bond or a (t+1)-valent linking group, C represents a single bond, —NR—, —CO—, —$CO_2$—, —$SO_2$—, —O—, —S—, or a group formed by a combination thereof, and R represents a hydrogen atom, an alkyl group, or an aryl group, D represents a single bond, an alkylene group, or an arylene group, E represents —N(Rpa)(Rpb), Rpa and Rpb each independently represent an alkyl group or an aryl group, and Rpa and Rpb may be linked with each other to form a ring, and t represents an integer of 1 to 5; and

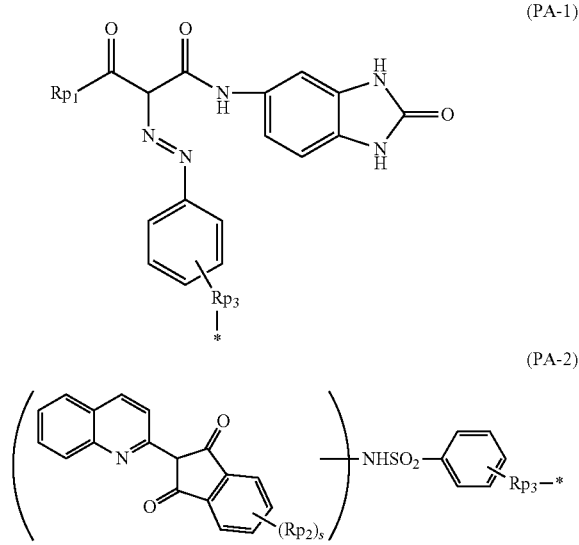

in General Formulae (PA-1) and (PA-2), $Rp_1$ represents an alkyl group or an aryl group, $Rp_2$ represents a hydrogen atom, a halogen atom, an alkyl group, or a hydroxyl group, $Rp_3$ represents a single bond, —NR—, —CO—, —$CO_2$—, —$SO_2$—, —O—, —S—, or a group formed by a combination thereof, and R represents a hydrogen atom, an alkyl group, or an aryl group, s represents an integer of 1 to 4, and in the case where s is 2 or more, a plurality of $Rp_2$'s may be the same as or different from each other, and

* represents a linking moiety with B.

$Rp_1$ is preferably a methyl group or a phenyl group, and the most preferably a methyl group.

$Rp_2$ is preferably a halogen atom, and the most preferably a chlorine atom.

$Rp_3$ represents a single bond, —NR—, —CO—, —$CO_2$—, —$SO_2$—, —O—, —S—, or a group formed of a combination thereof, and R represents a hydrogen atom, an alkyl group, or an aryl group. Examples of a combination of such groups include —NRCO—, —CONR—, —$SO_2$NR—, and —NR$SO_2$—.

$Rp_3$ is preferably a single bond, —NR—, —NRCO—, or —CONR—, and more preferably —NR—, —NRCO—, or —CONR—.

R represents a hydrogen atom, an alkyl group, or an aryl group. Examples of the alkyl group represented by R include linear, branched, and cyclic ones, with the linear or branched ones are preferable. The number of carbon atoms of the alkyl group is preferably 1 to 10, and more preferable 1 to 5. The number of carbon atoms of the aryl group represented by R is preferably 6 to 30, more preferably 6 to 20, and still more preferably 6 to 12. R is preferably a hydrogen atom.

In General Formula (P), A is preferably (PA-1) from the viewpoints of improving the dispersibility and suppressing the brightness unevenness.

In General Formula (P), examples of the (t+1)-valent linking group represented by B include an alkylene group, an arylene group, and a heteroarylene group. Examples of the alkylene group include linear, branched, and cyclic ones.

As the (t+1)-valent linking group, linking groups represented by the following Structural Formulae (PA-4) to (PA-9) are preferable. * represents a linking moiety with A and C.

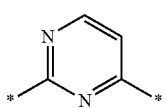

(PA-4)

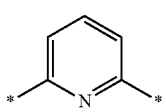

(PA-5)

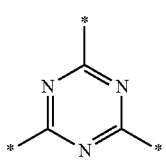

(PA-6)

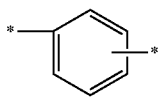

(PA-7)

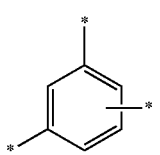

(PA-8)

-continued

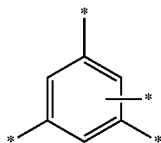
(PA-9)

From the viewpoints of improving the dispersibility and suppressing the brightness unevenness, among Structural Formulae (PA-4) to (PA-9), the linking groups represented by Structural Formulae (PA-6) to (PA-9) are preferable, the linking groups represented by Structural Formulae (PA-7) to (PA-9) are more preferable, and the linking group represented by Structural Formula (PA-7) is particularly preferable.

In General Formula (P), C represents a single bond, —NR—, —CO—, —CO$_2$—, —SO$_2$—, —O—, —S—, or a group formed of a combination thereof. Examples of the combination of the groups include —NRCO—, —CONR—, —SO$_2$NR—, and —NRSO$_2$—. C is preferably —NR—, —NRCO—, —CONR—, —SO$_2$NR—, or —NRSO$_2$—, and more preferably —NRCO— or —CONR—. R represents a hydrogen atom, an alkyl group, or an aryl group. Preferred ranges of the alkyl group and the aryl group represented by R have the same definitions as the preferred range described for Rp$_3$. R is preferably a hydrogen atom.

In General Formula (P), examples of the alkylene group and the arylene group represented by D include a methylene group, an ethylene group, a propylene group, a butylene group, a pentylene group, a hexylene group, a decylene group, a cyclopropylene group, a cyclobutylene group, a cyclopentylene group, a cyclohexylene group, a cyclooctylene group, a cyclodecylene group, a phenylene group, and a naphthylene group. Among these, D is preferably a linear alkylene group, and more preferably a linear alkylene group having 1 to 5 carbon atoms.

In General Formula (P), E represents —N(Rpa)(Rpb). Examples of the alkyl group and the aryl group in Rpa and Rpb include a methyl group, an ethyl group, a propyl group, an isopropyl group, a butyl group, a sec-butyl group, a tert-butyl group, a pentyl group, an isopentyl group, a neopentyl group, a hexyl group, an octyl group, a decyl group, a cyclopropyl group, a cyclobutyl group, a cyclopentyl group, a cyclohexyl group, a cyclooctyl group, a cyclodecyl group, a phenyl group, and a naphthyl group. Rpa and Rpb are particularly preferably a linear or branched alkyl group, and the most preferably a linear or branched alkyl group having 1 to 5 carbon atoms.

In General Formula (P), t is preferably 1 or 2, and more preferably 2.

Specific examples of the pigment derivative are shown below, but the present invention is not limited thereto. With regard to other pigment derivatives, reference can be made to the descriptions in paragraphs 0162 to 0183 of JP2011-252065A, the contents of which are incorporated herein. In the following formulae, Me represents a methyl group, Et represents an ethyl group, and M represents a hydrogen atom, or an atom or atomic group forming a salt. Examples of the atom or atomic group forming a salt include alkali metals such as a lithium atom, a sodium atom, and a potassium atom, ammonium, and tetraalkylammonium.

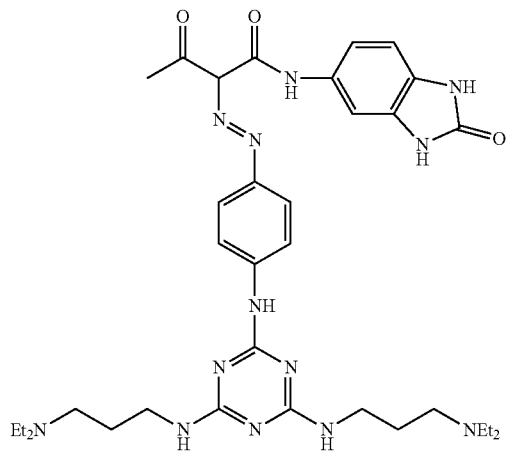
(A-1)

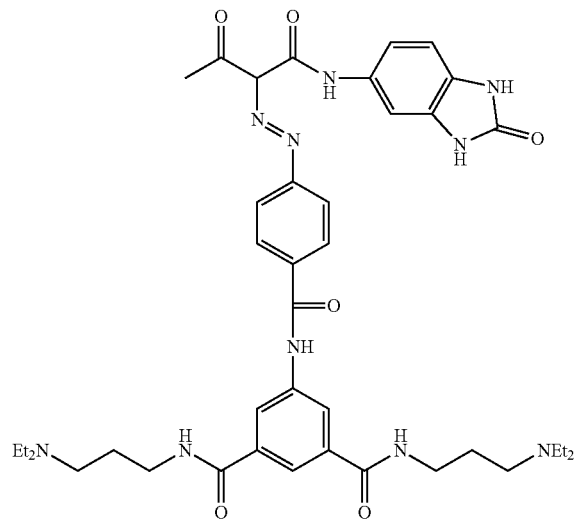
(A-2)

-continued
(A-3)
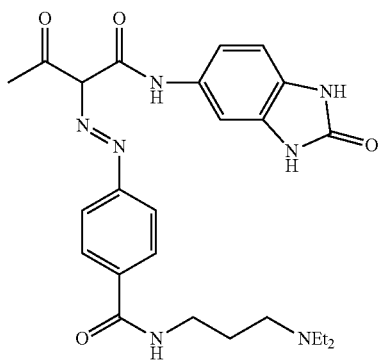
(A-4)
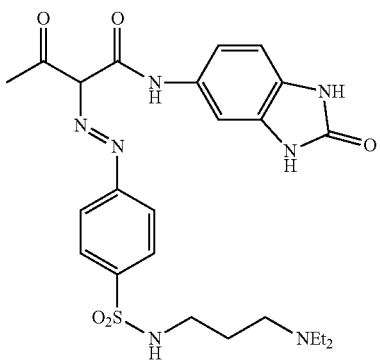
(A-5)
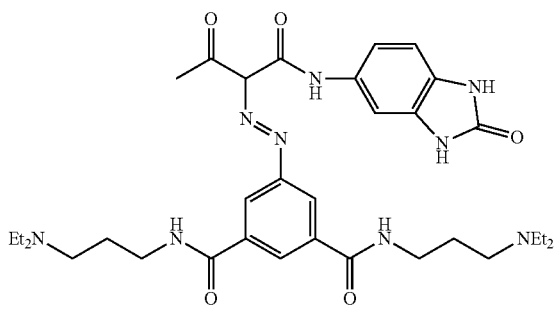
(A-6)
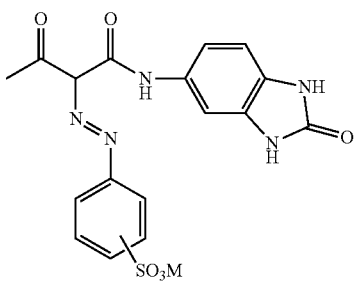
(A-7)
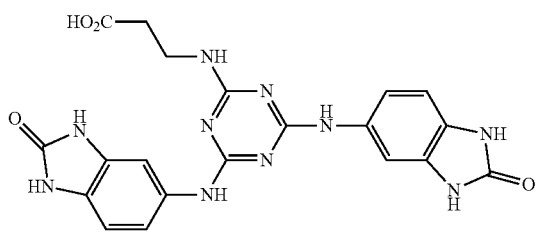
(A-8)
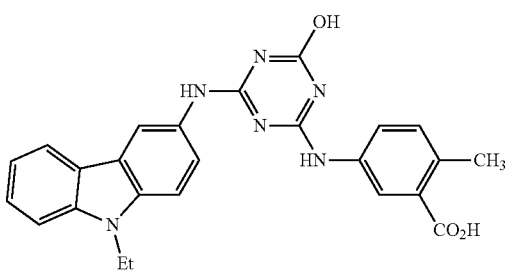
(A-9)
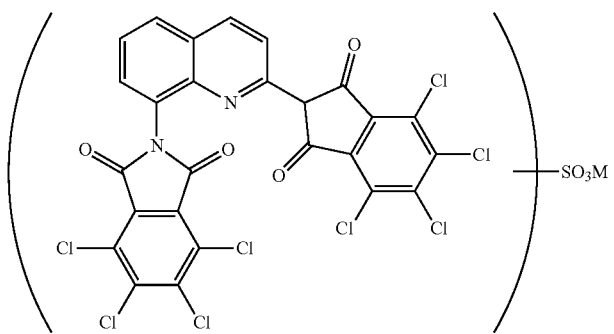
(A-10)
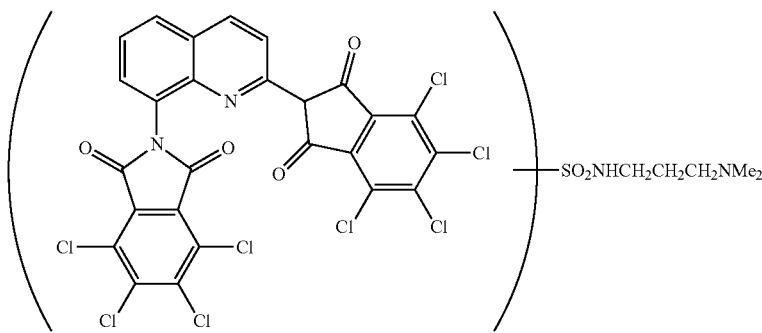

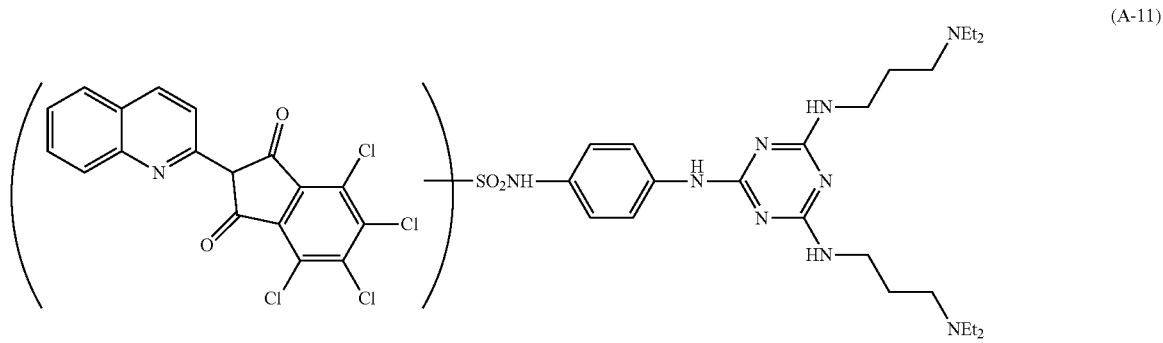
(A-11)
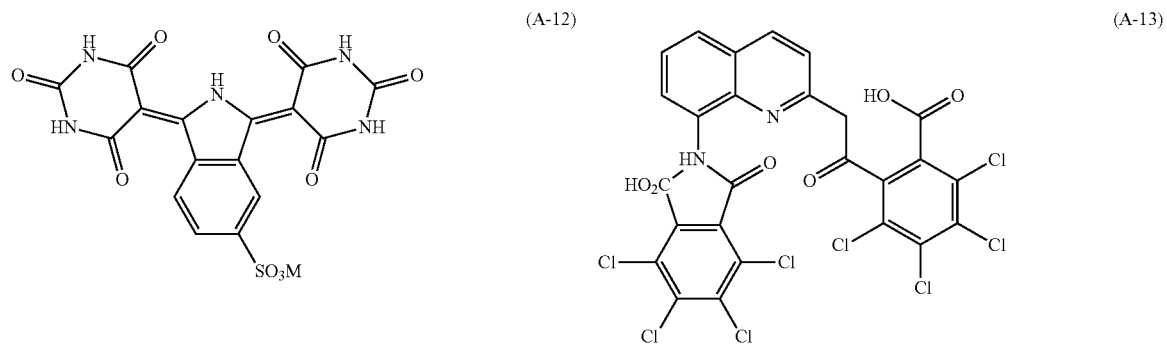
(A-12) (A-13)
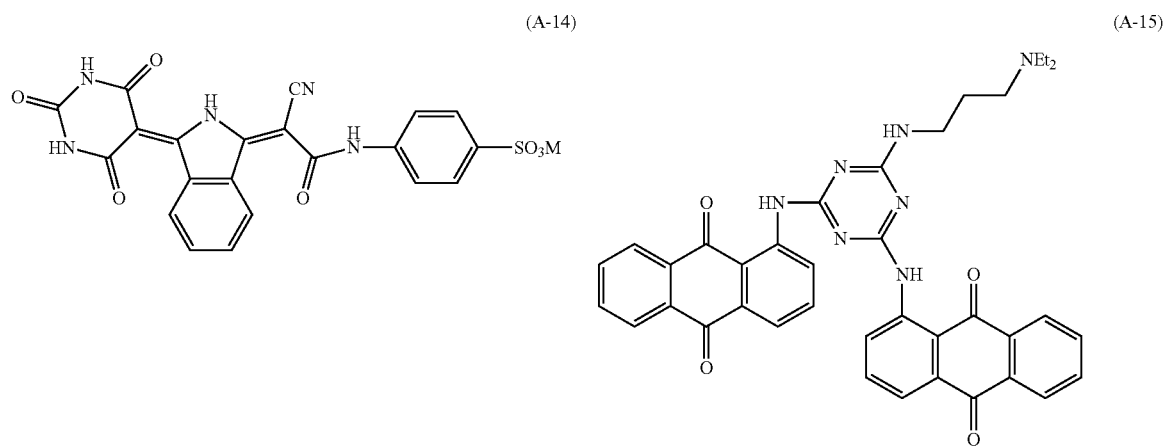
(A-14) (A-15)
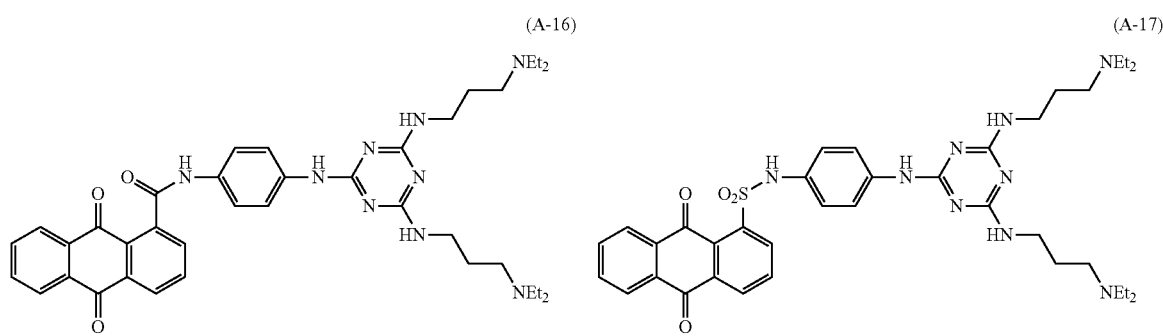
(A-16) (A-17)

-continued
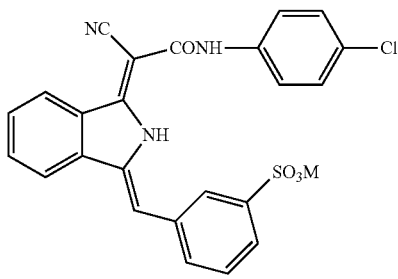
(A-18)
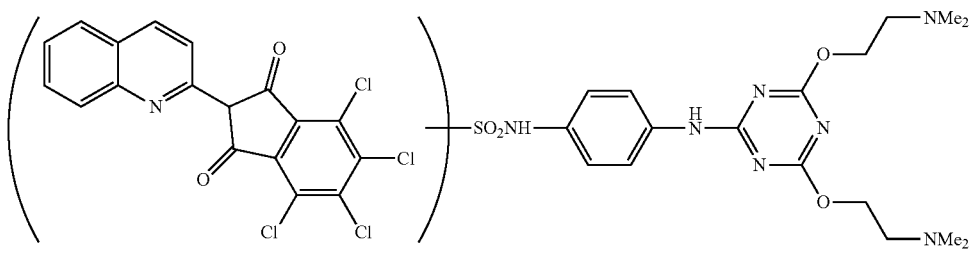
(A-19)
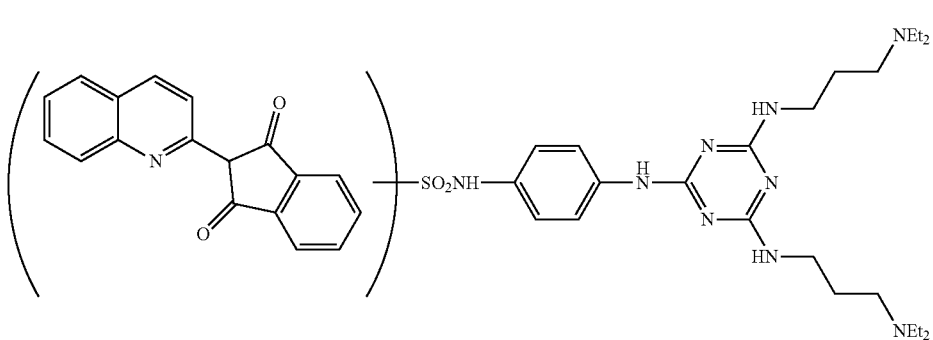
(A-20)
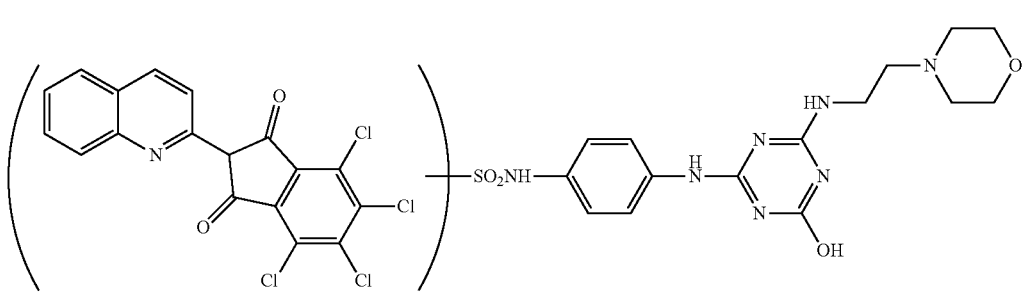
(A-21)
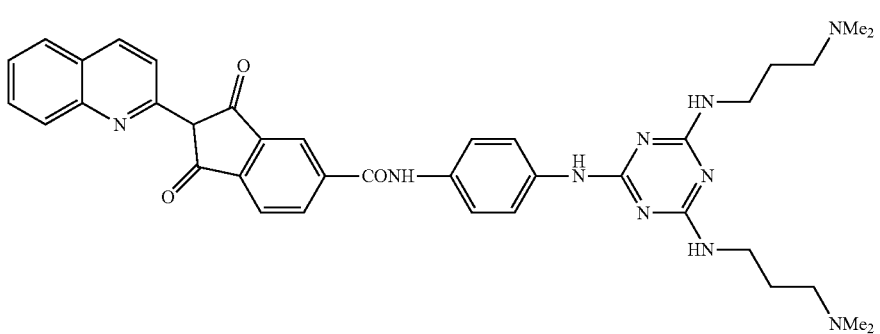
(A-22)

-continued
(A-23)
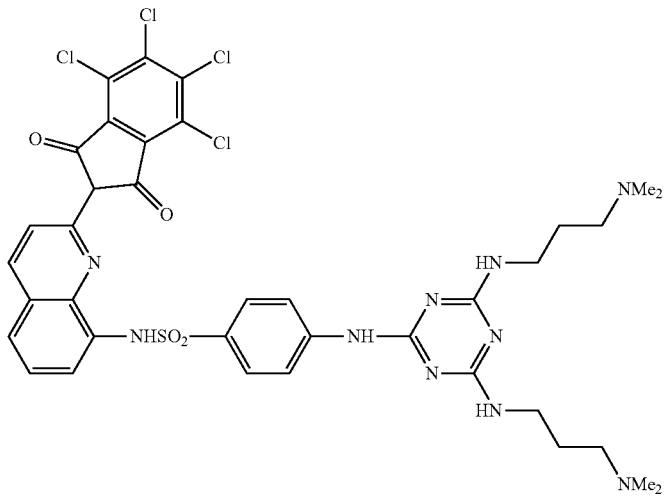
(A-24) (A-25)
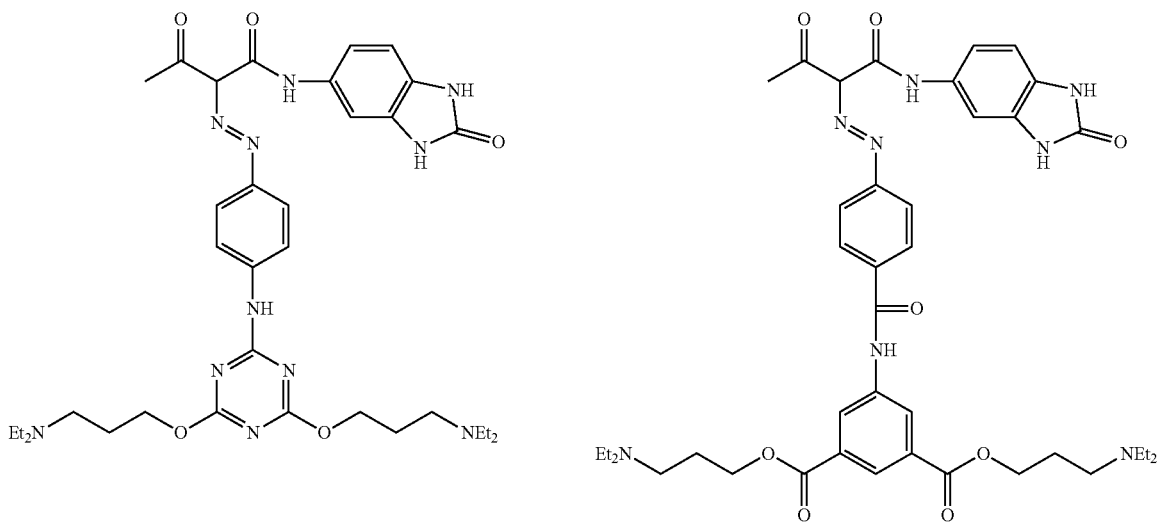
(A-26) (A-27)
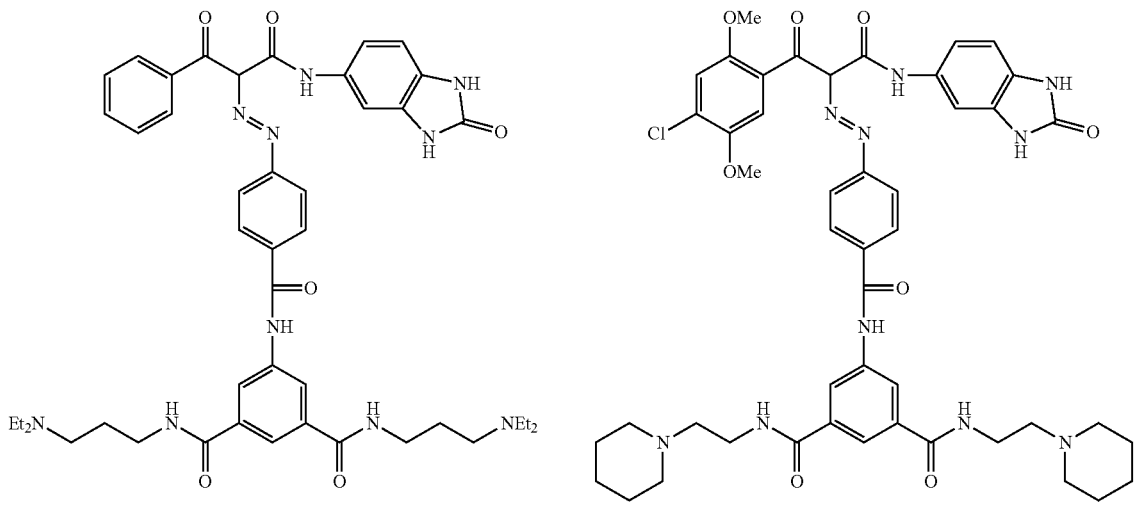

-continued (A-28)

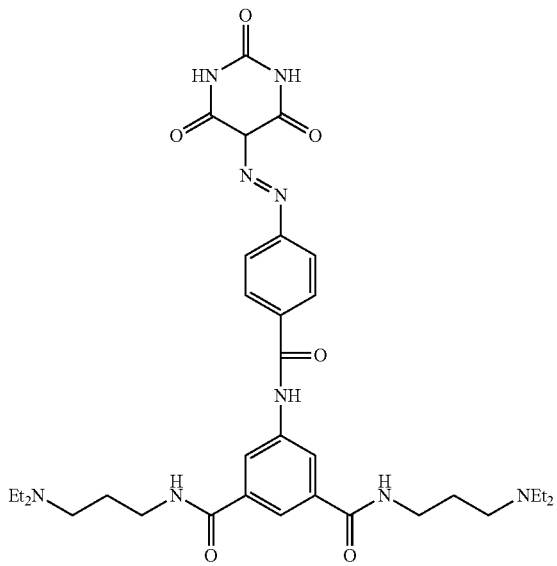

(A-29)

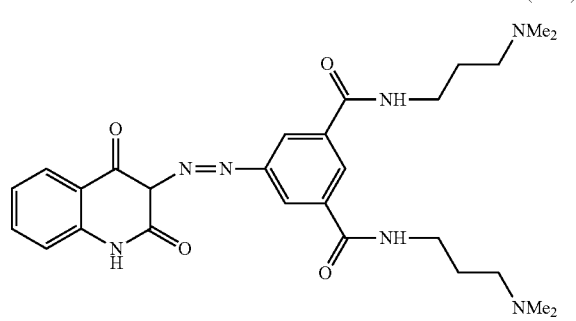

The content of the pigment derivative in the coloring composition of In the present invention is preferably 1% to 30% by mass, with respect to the total mass of the pigment. The lower limit is more preferably 5% by mass or more, and still more preferably 10% by mass or more. The upper limit is more preferably 25% by mass or less, and still more preferably 19% by mass or less. The pigment derivative may be used singly or in combination of two or more kinds thereof.

<<Solvent>>

The coloring composition of the present invention preferably includes a solvent.

Basically, the solvent is not particularly limited as long as it satisfies the solubility of the respective components or the coating properties of the coloring composition, but is preferably selected in consideration of the solubility of a colorant, a resin, a polymerizable compound, or the like, the coating properties, and the safety.

Suitable examples of the solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetate (e.g.: methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (e.g.: methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (e.g.: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methyl propionate and ethyl 2-oxy-2-methyl propionate (e.g.: methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate, propylene glycol ethyl ether acetate, and propylene glycol propyl ether acetate; ketones such as methyl ethyl ketone, cyclopentanone, cyclohexanone, 2-heptanone, and 3-heptanone; and aromatic hydrocarbons such as toluene and xylene.

From the viewpoints of the solubility of a colorant, a resin, a polymerizable compound, and the like, the improvement in the shape of coated surfaces, and the like, it is also preferable to mix two or more kinds of these solvents. A mixed solution consisting of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclopentanone, cyclohexanone, ethyl carbitol acetate, butyl carbitol acetate, propylene glycol methyl ether, and propylene glycol methyl ether acetate is preferable.

The solvent preferably has a content of peroxides of 0.8 mmol/L or less, and the solvent which does not substantially include peroxides is more preferably used.

From the viewpoint of coating properties, the content of the solvent is preferably set such that the concentration of the total solid contents of the coloring composition becomes 5% to 80% by mass. The lower limit is, for example, more preferably 5% by mass or more, and still more preferably 10% by mass or more. The upper limit is, for example, more preferably 60% by mass or less, and still more preferably 50% by mass or less.

The coloring composition of the present invention may include one kind or two or more kinds of the solvent. In a case where the coloring composition includes two or more kinds of the solvent, the total amount thereof preferably falls within the range.

<<Polymerization Inhibitor>>

A small amount of a polymerization inhibitor is preferably added to the coloring composition of the present invention in order to prevent unnecessary thermal polymerization of the polymerizable compound during the production or preservation of the coloring composition.

Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine cerous salt (an ammonium salt, a cerous salt, and the like).

In a case where the coloring composition of the present invention includes a polymerization inhibitor, the content of the polymerization inhibitor is preferably about 0.01% to 5% by mass with respect to the mass of the coloring composition.

The coloring composition of the present invention may include one kind or two or more kinds of the polymerization inhibitor. In a case where the coloring composition includes two or more kinds of the polymerization inhibitor, the total amount thereof preferably falls within the range.

<<Surfactant>>

From the viewpoint of further improving coating properties, various surfactants may be added to the coloring composition. As the surfactants, various surfactants such as a fluorine-based surfactant, a nonionic surfactant, a cationic surfactant, an anionic surfactant, and a silicone-based surfactant can be used.

For example, if the coloring composition of the present invention contains a fluorine-based surfactant, liquid characteristics (in particular, fluidity) are further improved when the composition is prepared as a coating liquid. That is, in the case where a film is formed using the coloring composition containing a fluorine-based surfactant, the interface tension between a surface to be coated and the coating liquid is reduced to improve wettability with respect to the surface to be coated, and enhance coating properties with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coated film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781, and MEGAFACE F781F (all manufactured by DIC Corporation); FLUORAD FC430, FC431, and FC171 (all manufactured by Sumitomo 3M); SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all manufactured by ASAHI GLASS Co., Ltd.); and PF636, PF656, PF6320, PF6520, and PF7002 (manufactured by OMNOVA).

As the fluorine-based surfactant, a block polymer can also be used, and specific examples thereof include the compounds described in JP2011-89090A.

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.). Further, PIONIN D-6315 and D-6112-W manufactured by Takemoto Oil & Fat Co., Ltd. can also be used.

Specific examples of the cationic surfactant include phthalocyanine derivatives (trade name: EFKA-745 manufactured by MORISHITA KAGAKU SANGYO Corporation), organosiloxane polymer KP341 (manufactured by Shin-Etsu Chemical Co., Ltd.), (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray CO., LTD., "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Chemical Co., Ltd., and "BYK307", "BYK323", and "BYK330", manufactured by BYK Additives & Instruments.

In a case where the coloring composition of the present invention includes a surfactant, the content of the surfactant is preferably 0.001% to 2.0% by mass, and more preferably 0.005% to 1.0% by mass, with respect to the total mass of the coloring composition.

The coloring composition of the present invention may include one kind or two or more kinds of the surfactant. In a case where the coloring composition includes two or more kinds of the surfactant, the total amount thereof preferably falls within the range.

<<Silane Coupling Agent>>

The coloring composition of the present invention includes a silane coupling agent.

The silane coupling agent is also preferably a silane compound having at least two kinds of functional groups having different reactivities per molecule and particularly preferably the compound having as the functional group, an amino group and an alkoxy group. Examples of such an silane coupling agent include N-β-aminoethyl-γ-aminopropyl-methyldimethoxysilane (KBM-602, trade name, manufactured by Shin-Etsu Chemical Co., Ltd.), N-β-aminoethyl-γ-aminopropyltrimethoxysilane (KBM-603, trade name, manufactured by Shin-Etsu Chemical Co., Ltd.), N-β-aminoethyl-γ-aminopropyltriethoxysilane (KBE-602, trade name, manufactured by Shin-Etsu Chemical Co., Ltd.), γ-aminopropyltrimethoxysilane (KBM-903, trade name, manufactured by Shin-Etsu Chemical Co., Ltd.), γ-aminopropyltriethoxysilane (KBE-903, trade name, manufactured by Shin-Etsu Chemical Co., Ltd.), and 3-methacryloxypropyltrimethoxysilane (KBM-503, trade name, manufactured by Shin-Etsu Chemical Co., Ltd.). With regard to the details of the silane coupling agent, reference can be made to the descriptions in paragraph Nos. 0155 to 0158 of JP2013-254047A, the contents of which are incorporated herein.

In a case where the coloring composition of the present invention includes a silane coupling agent, the content of the silane coupling agent is preferably 0.001% to 20% by mass, more preferably 0.01% to 10% by mass, and particularly preferably 0.1% by mass to 5% by mass, with respect to the total solid content of the coloring composition.

The coloring composition of the present invention may include one kind or two or more kinds of the silane coupling agent. In a case where the coloring composition includes two or more kinds of the silane coupling agent, the total amount thereof preferably falls within the range.

<<Other Additives>>

Various additives such as a filler, an antioxidant, an ultraviolet absorbent, and an aggregation inhibitor can be blended into the coloring composition of the present invention, if desired. Examples of these additives include those described in paragraphs 0155 to 0156 of JP2004-295116A, the contents of which are incorporated herein. As the antioxidant, for example, a phenol compound, a phosphorus-based compound (for example, the compounds described in paragraph 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof.

The coloring composition of the present invention may include the sensitizer or the light stabilizer described in paragraph 0078 of JP2004-295116A, or the thermal polymerization inhibitor described in paragraph 0081 of the same publication.

<Method for Producing Coloring Composition>

The coloring composition of the present invention is produced by mixing the components as described above.

During the production of the coloring composition, the respective components constituting the coloring composition may be mixed together at the same time or mixed together sequentially after being dissolved and dispersed in a solvent.

The method for producing a coloring composition of the present invention preferably includes dispersing a colorant including C. I. Pigment Red 264 in the presence of an acidic graft resin (dispersing step).

In the dispersing step, a solvent or a pigment derivative may be further added, if desired.

The dispersing step can be carried out using a dispersing device such as a beads mill.

Furthermore, in a case where the coloring composition of the present invention further includes other colorants as described above, the coloring composition can be produced by dispersing a colorant including C. I. Pigment Red 264 and other colorants at the same time in the presence of an acidic graft resin. Further, the coloring composition can also be produced by carrying out the dispersing step per colorant, and mixing a composition (dispersion liquid) in which the respective colorants are dispersed. In a case of carrying out the dispersing step per colorant, the step of dispersing such other colorants may be carried out in the presence of a dispersant other than the above-mentioned acidic graft resin, but is preferably carried out in the presence of an acidic graft resin from the viewpoint of dispersion stability.

By adding the respective components such as a polymerizable compound and a photopolymerization initiator to the composition (dispersion liquid) after the dispersing step, the coloring composition of the present invention is obtained. Other components may be mixed together at the same time or mixed together sequentially after being dissolved and dispersed in a solvent. Further, the order of the components to be introduced or the operational conditions during the blending is not particularly limited. For example, the composition may be prepared by dissolving or dispersing all the components in a solvent at the same time, or by appropriately leaving the respective components in two or more solutions/dispersion liquids, and mixing them into a solution (during the coating), if desired.

In the method for producing a coloring composition of the present invention, it is preferable that the coloring composition is filtered using a filter for the purpose of removing impurities or reducing deficit, for example. As the filter, any filters that have been used in the related art for filtration use and the like may be used without particular limitation. Examples of the filter include filters formed of a fluorine resin such as polytetrafluoroethylene (PTFE), a polyamide-based resin such as Nylon-6 and Nylon-6,6, and a polyolefin resin (including a high density and a ultrahigh molecular weight) such as polyethylene and polypropylene (PP). Among these materials, polypropylene (including high-density polypropylene) is preferable.

The pore diameter of the filter is suitably approximately 0.01 to 7.0 μm, preferably approximately 0.01 to 3.0 μm, and more preferably approximately 0.05 to 0.5 μm. By setting the pore diameter of the filter to the range, it is possible to reliably remove fine foreign matters, which interfere with the preparation of a uniform and smooth coloring composition in the later steps.

When using the filter, different filters may be combined. Here, the filtration through the first filter may be run once, or may be repeated twice or more times.

Incidentally, the first filters having different pore diameters within the above range may be combined. With regard to the pore diameter of the filter herein, reference can be made to nominal values of filter manufacturers. A commercially available filter may be selected from various filters provided by Nihon Pall Corporation, Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration with the second filter may be carried out.

Since the coloring composition of the present invention is capable of forming a cured film having good light resistance, color transfer properties, and flatness, it is suitably used for forming a colored layer of a color filter. Further, the coloring composition of the present invention can be suitably used for forming a colored pattern of a color filter or the like used in a solid-state imaging element such as a charge coupled device (CCD) and a complementary metal oxide semiconductor (CMOS), and an image display device such as a liquid crystal display device. Moreover, the coloring composition can also be suitably used for preparing a print ink, an ink jet ink, a coating material, and the like. Among these, the coloring composition can also be suitably used in an application of the manufacture of a color filter for a solid-state imaging element such as CCD and CMOS.

<Color Filter, Pattern Forming Method, and Method for Manufacturing Color Filter>

Next, the color filter, the pattern forming method, and the color filter of the present invention will be described in detail with reference to the methods thereof. Further, a method for manufacturing a color filter, including the pattern forming method of the present invention, will also be described.

The color filter of the present invention is formed using the coloring composition of the present invention.

In the pattern forming method of the present invention, a coloring composition layer is formed on a support applying the coloring composition of the present invention, and an undesired area is removed to form a colored pattern.

The pattern forming method of the present invention can be suitably applied to formation of the colored pattern of the color filter.

In the pattern forming method of the present invention, pattern formation may be carried out by a so-called photolithography method or pattern formation may be carried out by a dry etching method.

That is, a first aspect of the method for manufacturing a color filter of the present invention includes forming a coloring composition layer on a support, applying the coloring composition of the present invention, exposing a coloring composition layer in a pattern shape, and removing the unexposed area by development to form a colored pattern. If desired, baking the coloring composition layer (pre-baking step), and baking the developed colored pattern (post-baking step) may be provided.

Furthermore, a second aspect of the method for manufacturing a color filter of the present invention includes a step of forming a coloring composition layer on a support, using the coloring composition of the present invention, a step of forming a colored layer by curing, a step of forming a photoresist layer on the colored layer, a step of patterning the photoresist layer by exposure and development to obtain a resist pattern, a step of dry-etching the colored layer with a resist pattern as an etching mask to form a colored pattern.

The color filter of the present invention can be suitably obtained by the production method. The details thereof will be described below.

<<Step of Forming Coloring Composition Layer>>

In the step of forming a coloring composition layer, the coloring composition of the present invention is used to form a coloring composition layer on a support.

As the support, for example, a substrate for a solid-state imaging element, in which a solid-state imaging element (light receiving element) such as a CCD and a CMOS on a substrate (for example, a silicon substrate) can be used.

The colored pattern of the present invention may be formed on the side (front surface) on which a solid-state imaging element is formed, or may be formed on the face side (back surface) on which the solid-state imaging element is not formed in a substrate for the solid-state imaging element.

On the support, an undercoat layer may be provided, if desired, in order to improve adhesion with an upper layer, prevent the diffusion of materials, or flatten the surface of a substrate.

As a method of applying the coloring composition of the present invention onto the support, various coating methods such as a slit coating method, a spray coating method, an ink jet method, a spin coating method, a cast coating method, a roll coating method, and a screen printing method can be used.

The drying (pre-baking) of the coloring composition layer applied onto the support may be carried out under the conditions of a temperature of 50° C. to 140° C. for 10 to 300 seconds, using a hot plate, an oven, or the like.

<<<Exposing Step>>>

Next, the coloring composition layer formed on the support is exposed in a pattern shape (exposing step). For example, the coloring composition layer formed on the support can be subjected to patternwise exposure using, for example, an exposure device such as a stepper through a mask having a predetermined mask pattern. Thus, the exposed portion can be cured.

As the radiation (light) which can be used during the exposure, ultraviolet rays such as a g-line and an i-line (particularly preferably an i-line) are preferably used. The irradiation dose (exposure dose) is, for example, preferably 30 to 1,500 mJ/cm$^2$, more preferably 50 to 1,000 mJ/cm$^2$, and the most preferably 80 to 500 mJ/cm$^2$. The oxygen concentration during the exposure can be appropriately selected, and exposure may be performed in an atmosphere, or may also be performed, for example, in a low-oxygen environment having an oxygen concentration of 19% by volume or less (for example, 15% by volume, 5% by volume, and substantially oxygen-free) or in a high-oxygen environment having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

The film thickness of the cured film is preferably 1.0 μm or less, more preferably 0.1 to 0.9 μm, and still more preferably 0.2 to 0.8 μm. By setting the film thickness to 1.0 μm or less, high resolution and high adhesiveness are easily obtained.

<<<Pattern Forming Step>>>

Next, the unexposed area is removed by development to form a colored pattern (pattern forming step). The removal of the unexposed area by development can be carried out using a developer. Thus, coloring composition layer of the unexposed area in the exposing step is eluted into the developer, and as a result, only a photocured portion remains.

As the developer, an organic alkali developer causing no damage on the underlying solid-state imaging element or a circuit is preferable.

The temperature of the developer is preferably, for example, 20° C. to 30° C., and the development time is preferably 20 to 180 seconds. In addition, in order to improve the residue removing properties, a step in which the developer is discharged every 60 seconds and a fresh developer is supplied may be repeated several times.

Examples of the alkali agent used for the developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, dimethylbis(2-hydroxyethyl)ammonium hydroxide, choline, pyrrole, piperidine, and 1,8-diazabicyclo-[5,4,0]-7-undecene. An aqueous alkaline solution obtained by diluting the alkali agent with pure water to have a concentration of 0.001% to 10% by mass, and preferably 0.01% to 1% by mass is preferably used as the developer.

In addition, an inorganic alkali may be used in a developer. Preferred examples of the inorganic alkali include sodium hydroxide, potassium hydroxide, sodium carbonate, sodium hydrogen carbonate, sodium silicate, and sodium metasilicate. Further, a surfactant may also be used in the developer. Examples of the surfactant include the surfactants described as the above-mentioned coloring composition, with a nonionic surfactant being preferable.

Incidentally, in a case where a developer composed of such an aqueous alkaline solution is used, cleaning (rinsing) with pure water is generally performed after development.

After development, it is preferable to carry out a heating treatment (post-baking) after carrying out drying. When forming a multicolor colored pattern, a cured film can be produced by repeating the respective steps sequentially per color, thereby obtaining a color filter.

The post-baking is a heat treatment after development so as to complete curing, and the heat temperature is, for example, preferably 100° C. to 240° C., and more preferably 200° C. to 240° C.

The post-baking treatment may be carried out continuously or batchwise by using a heating unit such as a hot plate, a convection oven (hot air circulating dryer), and a high-frequency heater so that the coating film after development satisfies the conditions.

The color filter of the present invention can be suitably used in a solid-state imaging element such as CCD and CMOS, and particularly suitable for a high resolution CCD, CMOS, or the like, having 1,000,000 or more pixels.

The color filter of the present invention can be used as a color filter which is interposed between a light receiving portion of the respective pixels constituting, for example, a CCD or a CMOS, and a microlens for collecting light.

The film thickness of the colored pattern (colored pixel) in the color filter of the present invention is preferably 2.0 µm or less, more preferably 1.0 µm or less, and still preferably 0.7 µm or less. The lower limit can be set to, for example, 0.1 µm or more, or to 0.2 µm or more.

Furthermore, the size (pattern width) of the colored pattern (colored pixel) is preferably 2.5 µm or less, more preferably 2.0 µm or less, and particularly preferably 1.7 µm or less. The lower limit can be set to, for example, 0.1 µm or more, or to 0.2 µm or more.

In a case of forming a pattern by dry etching, reference can be made to the descriptions in JP2013-64993A, the contents of which are incorporated herein.

<Solid-State Imaging Element>

The solid-state imaging element of the present invention includes the color filter of the present invention as described above. The constitution of the solid-state imaging element of the present invention is not particularly limited as long as the solid-state imaging element is constituted to include the color filter in the present invention and function as a solid-state imaging element. However, for example, the solid-state imaging element can be constituted as below.

The solid-state imaging element has a configuration which has a plurality of photodiodes constituting a light receiving area of a solid-state imaging element (a CCD image sensor, a CMOS image sensor, or the like) and a transfer electrode formed of polysilicon or the like, on a support; a light shielding film formed of tungsten or the like onto the photodiodes and the transfer electrodes, which has openings only over the light receiving portion of the photodiode; a device protecting film formed of silicon nitride or the like, which is formed to cover the entire surface of the light shielding film and the light receiving portion of the photodiodes, on the light shielding film; and the color filter for a solid-state imaging element of the present invention on the device protecting film.

In addition, the solid-state imaging element may have a configuration in which a light collecting means (for example, a micro lens, the same applies hereinafter) is disposed on the device protective layer and under the color filter (a side closer to the support), a configuration in which a light condensing means is disposed on the color filter, or other configurations.

<Image Display Device>

The color filter of the present invention can be used for an image display device such as a liquid crystal display device and an organic electroluminescence display device. In particular, the color filter is suitable in the applications of the liquid crystal display device. The liquid crystal display device including the color filter of the present invention can display a high-quality image having good tint of a display image and excellent display characteristics.

The definition of display devices or the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color Thin Film Transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as In Plane Switching (IPS), a pixel division system such as Multi-domain Vertical Alignment (MVA), or the like, or to Super-Twist Nematic (STN), Twisted Nematic (TN), Vertical Alignment (VA), on-chip spacer (OCS), fringe field switching (FFS), Reflective Optically Compensated Bend (R—OCB), and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. Since the color filter of the present invention has excellent light resistance or the like, a liquid crystal display device in a COA system which has high resolution and excellent long-term durability can be provided. In addition, in order to satisfy the characteristics required for a low dielectric constant, a resin coated film may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

The liquid crystal display device including the color filter in the present invention is constituted with various members such as an electrode substrate, a polarizing film, a retardation film, a backlight, a spacer, and a view angle compensation film, in addition to the color filter of the present invention. The color filter of the present invention can be applied to a liquid crystal display device constituted with these known members. These members are described in, for example, "94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the document, and the like.

If the color filter in the present invention is used in a liquid crystal display device, high contrast can be realized when the color filter is combined with a three-wavelength tube of a cold cathode fluorescent lamp known in the related art. Further, if a light source of light emitting diode (LED) in blue is used as a backlight, a liquid crystal display device having high brightness, high color purity, and good color reproducibility can be provided.

EXAMPLES

Hereinbelow, the present invention will be described in more detail with reference to Examples. The materials, amounts of use, proportions, treatment details, treatment procedures, and the like shown in Examples below can be modified as appropriate without departing from the spirit of the present invention. Therefore, the scope of the present invention is not intended to be limited to the specific examples shown below. Further, "part(s)" and "%" are given on the basis of mass unless otherwise specifically stated.

<Measurement of Weight-Average Molecular Weight>

The weight-average molecular weight was measured by the following method.

Columns: TOSOH TSKgel Super HZM-H, TOSOH TSKgel Super HZ4000, and TOSOH TSKgel Super HZ2000 connected in series;

Developing solvent: Tetrahydrofuran;

Column temperature: 40° C.;

Flow rate (injection amount of a sample): 1.0 µL (sample concentration: 0.1% by mass)

Apparatus: HLC-8220GPC manufactured by TOSOH CORPORATION;

Detector: Refractive Index (RI) detector;

Calibration curve base resin: Polystyrene

<Method for Measuring Acid Value>

A measurement sample was dissolved in a mixed solvent of tetrahydrofuran/water=9/1 (mass ratio), and the obtained solution was titrated by neutralization with a 0.1-mol/L aqueous sodium hydroxide solution, using a potentiometric titrator (trade name: AT-510, manufactured by Kyoto Electronics Manufacturing Co., Ltd.), at 25° C. The acid value was calculated by the following equation, using an inflection point in a titration pH curve as a titration end point.

$$A = 56.11 \times V_s \times 0.1 \times f/w$$

A: Acid value (mgKOH/g)

Vs: Used amount (mL) of the 0.1-mol/L aqueous sodium hydroxide solution required for titration f: Titer of the 0.1-mol/L aqueous sodium hydroxide solution w: Mass (g) (in terms of a solid content) of the measurement sample <Method for Measuring Base Value>

A measurement sample was dissolved in acetic acid, and the obtained solution was titrated by neutralization with a 0.1-mol/L aqueous perchloric acid/acetic acid solution, using a potentiometric titrator (trade name: AT-510, manufactured by Kyoto Electronics Manufacturing Co., Ltd.), at 25° C. The base value was calculated by the following equation, using an inflection point in a titration pH curve as a titration end point.

$$B = 56.11 \times V_s \times 0.1 \times f/w$$

B: Base value (mgKOH/g)

Vs: Used amount (mL) of the 0.1-mol/L aqueous perchloric acid/acetic acid solution required for titration f: Titer of the 0.1-mol/L aqueous perchloric acid/acetic acid solution w: Mass (g) (in terms of a solid content) of the measurement sample <Preparation of Pigment Dispersion Liquid>

Raw materials shown in the following table were mixed, and the mixed liquid was mixed and dispersed with a beads mill (diameter of a zirconia bead: 0.3 mm) for 3 hours. Thereafter, the mixed liquid was subjected to a dispersion treatment at a flow rate of 500 g/min at a pressure of 2,000 kg/cm³ using a high-pressure dispersion device equipped with a decompression mechanism NANO-3000-10 (manufactured by Japan BEE). The dispersion treatment was repeated 10 times to obtain a pigment dispersion liquid.

TABLE 1

| Pigment dispersion liquid | Addition amount (parts by mass) of PR264 | Yellow pigment Type | Yellow pigment Addition amount (parts by mass) | Resin Type | Resin Addition amount (parts by mass) | Pigment derivative Type | Pigment derivative Addition amount (parts by mass) | Solvent Type | Solvent Addition amount (parts by mass) |
|---|---|---|---|---|---|---|---|---|---|
| 1-1 | 13.0 | — | — | A-1 | 5.2 | P-1 | 1.3 | PGMEA | 80.5 |
| 1-2 | 13.0 | — | — | A-1 | 5.2 | P-1 | 2.0 | PGMEA | 79.8 |
| 1-3 | 13.0 | — | — | A-1 | 5.2 | P-1 | 2.6 | PGMEA | 79.2 |
| 1-4 | 13.0 | — | — | A-1 | 3.9 | P-1 | 2.0 | PGMEA | 81.1 |
| 1-5 | 13.0 | — | — | A-2 | 5.2 | P-1 | 2.0 | PGMEA | 79.8 |
| 1-6 | 13.0 | — | — | A-1 | 5.2 | P-2 | 2.0 | PGMEA | 79.8 |
| 1-7 | 13.0 | — | — | A-1 | 5.2 | P-3 | 2.0 | PGMEA | 79.8 |

TABLE 1-continued

| Pigment dispersion liquid | Addition amount (parts by mass) of PR264 | Yellow pigment Type | Addition amount (parts by mass) | Resin Type | Addition amount (parts by mass) | Pigment derivative Type | Addition amount (parts by mass) | Solvent Type | Addition amount (parts by mass) |
|---|---|---|---|---|---|---|---|---|---|
| 1-8 | 13.0 | — | — | A-5 | 5.2 | P-1 | 2.0 | PGMEA | 79.8 |
| 1-9 | 13.0 | — | — | A-6 | 5.2 | P-1 | 2.0 | PGMEA | 79.8 |
| 1-10 | 8.5 | PY139 | 4.6 | A-1 | 5.2 | P-1 | 2.0 | PGMEA | 79.8 |
| 1-11 | 8.5 | PY150 | 4.6 | A-1 | 5.2 | P-1 | 2.0 | PGMEA | 79.8 |
| 1-12 | 8.5 | PY185 | 4.6 | A-1 | 5.2 | P-1 | 2.0 | PGMEA | 79.8 |
| 1-13 | 13.0 | — | — | A-1 | 5.2 | — | — | PGMEA | 81.8 |
| 1-14 | 13.0 | — | — | A-2 | 5.2 | — | — | PGMEA | 81.8 |
| 1-15 | 8.5 | PY139 | 4.6 | A-1 | 5.2 | — | — | PGMEA | 81.8 |
| 1-16 | 8.5 | PY150 | 4.6 | A-1 | 5.2 | — | — | PGMEA | 81.8 |
| 1-17 | 8.5 | PY185 | 4.6 | A-1 | 5.2 | — | — | PGMEA | 81.8 |
| 1-18 | 13.0 | — | — | A-3 | 5.2 | P-1 | 2.0 | PGMEA | 81.8 |
| 1-19 | 13.0 | — | — | A-4 | 5.2 | P-1 | 2.0 | PGMEA | 81.8 |
| 1-20 | 13.0 | — | — | A-7 | 5.2 | P-1 | 2.0 | PGMEA | 81.8 |
| 1-21 | 13.0 | — | — | A-3 | 5.2 | — | — | PGMEA | 81.8 |
| 1-22 | 13.0 | — | — | A-3 | 5.2 | P-2 | 2.0 | PGMEA | 79.8 |
| 1-23 | 13.0 | — | — | A-3 | 5.2 | P-3 | 2.0 | PGMEA | 79.8 |
| 1-24 | 13.0 | — | — | A-3 | 5.2 | P-4 | 2.0 | PGMEA | 79.8 |
| 1-25 | 13.0 | — | — | A-4 | 5.2 | P-1 | 2.0 | PGMEA | 79.8 |
| 1-26 | 13.0 | — | — | A-4 | 5.2 | P-4 | 2.0 | PGMEA | 79.8 |
| 1-27 | 8.5 | PY139 | 4.6 | A-3 | 5.2 | P-1 | 2.0 | PGMEA | 79.8 |
| 1-28 | 8.5 | PY139 | 4.6 | A-3 | 5.2 | P-1 | 2.0 | PGMEA | 79.8 |
| 1-29 | 8.5 | PY139 | 4.6 | A-3 | 5.2 | P-1 | 2.0 | PGMEA | 79.8 |

TABLE 2

| Pigment dispersion liquid | Addition amount (parts by mass) of PR264 | Yellow pigment Type | Addition amount (parts by mass) | Resin Type | Addition amount (parts by mass) | Pigment derivative Type | Addition amount (parts by mass) | Solvent Type | Addition amount (parts by mass) |
|---|---|---|---|---|---|---|---|---|---|
| R1-1 | 13.0 | — | — | A-8 | 5.2 | — | — | PGMEA | 81.8 |
| R1-2 | 13.0 | — | — | A-9 | 5.2 | — | — | PGMEA | 81.8 |
| R1-3 | 13.0 | — | — | A-8 | 5.2 | P-1 | 2.0 | PGMEA | 79.8 |
| R1-4 | 13.0 | — | — | A-8 | 5.2 | P-2 | 2.0 | PGMEA | 79.8 |
| R1-5 | 13.0 | — | — | A-8 | 5.2 | P-3 | 2.0 | PGMEA | 79.8 |
| R1-6 | 13.0 | — | — | A-8 | 5.2 | P-4 | 2.0 | PGMEA | 79.8 |
| R1-7 | 13.0 | — | — | A-9 | 5.2 | P-1 | 2.0 | PGMEA | 79.8 |
| R1-8 | 13.0 | — | — | A-9 | 5.2 | P-4 | 2.0 | PGMEA | 79.8 |
| R1-9 | 8.5 | PY139 | 4.6 | A-8 | 5.2 | P-4 | 2.0 | PGMEA | 79.8 |
| R1-10 | 8.5 | PY139 | 4.6 | A-8 | 5.2 | P-4 | 2.0 | PGMEA | 79.8 |
| R1-11 | 8.5 | PY139 | 4.6 | A-8 | 5.2 | P-4 | 2.0 | PGMEA | 79.8 |

TABLE 3

| Pigment dispersion liquid | Addition amount (parts by mass) of PR264 | Yellow pigment Type | Addition amount (parts by mass) | Resin Type | Addition amount (parts by mass) | Pigment derivative Type | Addition amount (parts by mass) | Solvent Type | Addition amount (parts by mass) |
|---|---|---|---|---|---|---|---|---|---|
| Ye-1 | — | PY139 | 13 | A-1 | 5.2 | P-1 | 2.0 | PGMEA | 79.8 |
| Ye-2 | — | PY150 | 13 | A-1 | 5.2 | P-1 | 2.0 | PGMEA | 79.8 |
| Ye-3 | — | PY185 | 13 | A-1 | 5.2 | P-1 | 2.0 | PGMEA | 79.8 |
| Ye-4 | — | PY139 | 13 | A-1 | 5.2 | — | — | PGMEA | 81.8 |
| Ye-R-1 | — | PY139 | 13 | A-8 | 5.2 | — | — | PGMEA | 81.8 |
| Ye-R-2 | — | PY139 | 13 | A-9 | 5.2 | — | — | PGMEA | 81.8 |

The raw materials shown in the above table are as follows.
PR264: C. I. Pigment Red 264
PY139: C. I. Pigment Yellow 139
PY150: C. I. Pigment Yellow 150
PY185: C. I. Pigment Yellow 185

(Resin)

A-1: The following structure (acidic graft resin, weight-average molecular weight=12,000, acid value=64.9 mgKOH/g, base value=0 mgKOH/g, the numeral value described in the repeating unit of the main chain is a molar ratio, and the numeral value described in the repeating unit of the side chain is the number of repetition of the repeating moieties),

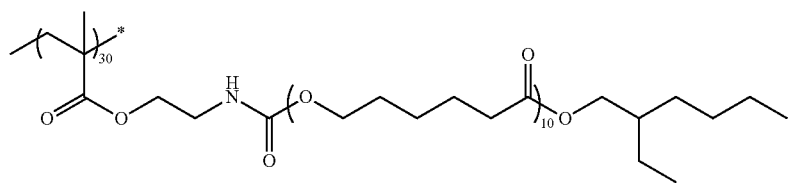

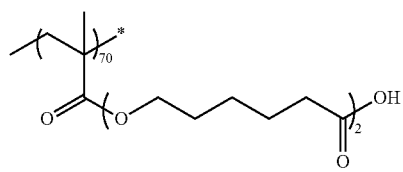

A-2: The following structure (acidic graft resin, weight-average molecular weight=13,000, acid value=51.7 mgKOH/g, base value=0 mgKOH/g, the numeral value described in the repeating unit of the main chain is a molar ratio, and the numeral value described in the repeating unit of the side chain is the number of repetition of the repeating moieties),

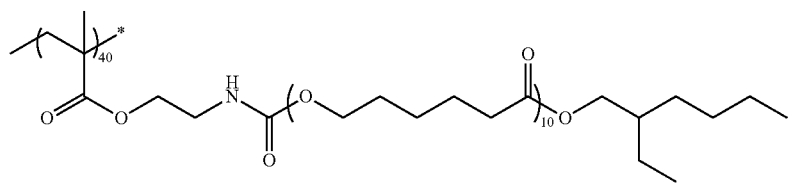

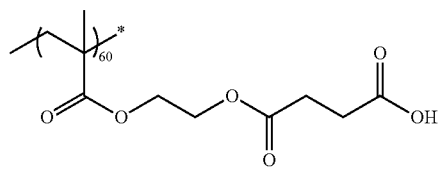

A-3: The following structure (acidic graft resin, weight-average molecular weight=11,000, acid value=51.6 mgKOH/g, base value=73.5 mgKOH/g, the numeral value described in the repeating unit of the main chain is a molar ratio, and the numeral value described in the repeating unit of the side chain is the number of repetition of the repeating moieties),

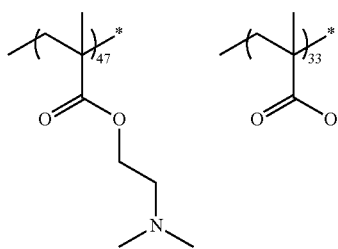

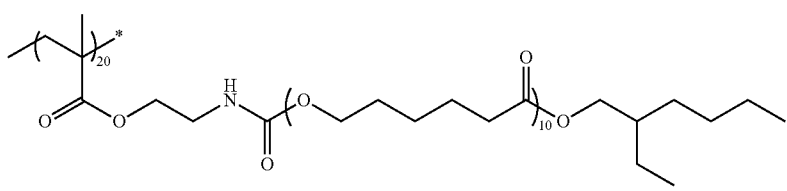

A-4: The following structure (acidic graft resin, weight-average molecular weight=15,000, acid value=32 mgKOH/g, base value=45 mgKOH/g, the numeral value described in the repeating unit of the main chain is a molar ratio, and the numeral value described in the repeating unit of the side chain is the number of repetition of the repeating moieties),

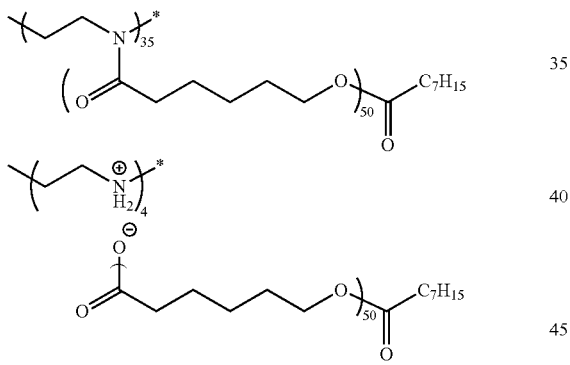

-continued

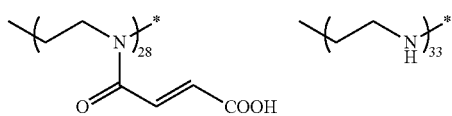

A-5: The following structure (acidic graft resin, weight-average molecular weight=10,000, acid value=58.2 mgKOH/g, base value=0 mgKOH/g, the numeral value described in the repeating unit of the main chain is a molar ratio, and the numeral value described in the repeating unit of the side chain is the number of repetition of the repeating moieties),

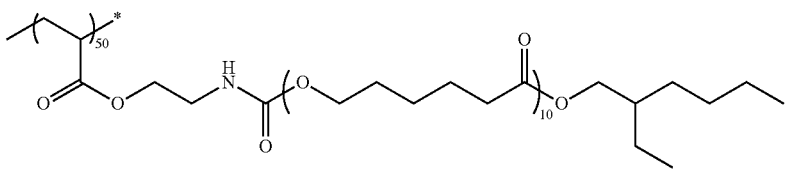

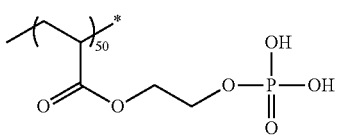

A-6: The following structure (acidic graft resin, weight-average molecular weight=15,000, acid value=4.8 mgKOH/g, base value=0 mgKOH/g, the numeral value described in the repeating unit of the main chain is a molar ratio, and the numeral value described in the repeating unit of the side chain is the number of repetition of the repeating moieties),

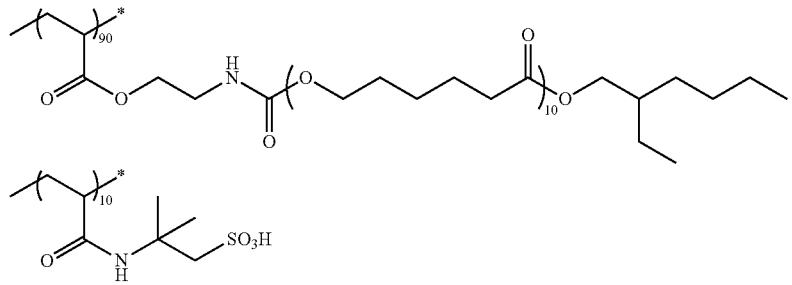

A-7: The following structure (acidic graft resin, weight-average molecular weight=13,000, acid value=48.6 mgKOH/g, base value=21.6 mgKOH/g, the numeral value described in the repeating unit of the main chain is a molar ratio, and the numeral value described in the repeating unit of the side chain is the number of repetition of the repeating moieties),

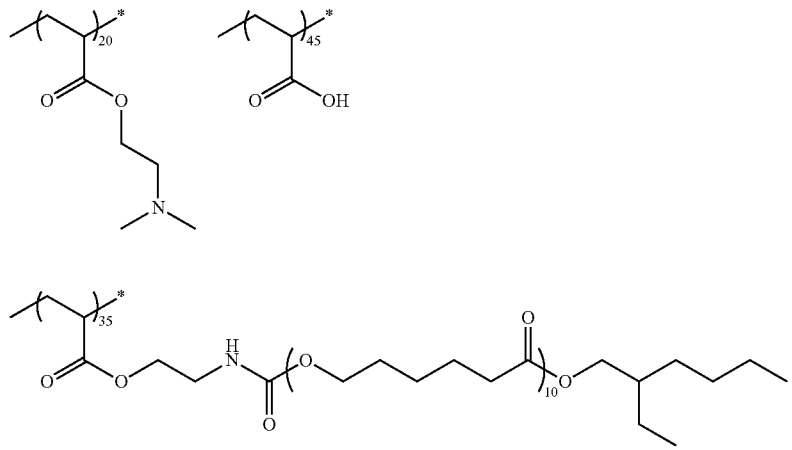

A-8: The following structure (graft resin having no acidic group, weight-average molecular weight=12,000, acid value=0 mgKOH/g, base value=187.2 mgKOH/g, the numeral value described in the repeating unit of the main chain is a molar ratio, and the numeral value described in the repeating unit of the side chain is the number of repetition of the repeating moieties), and

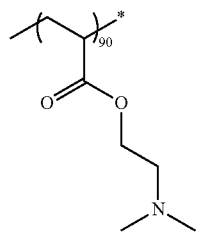

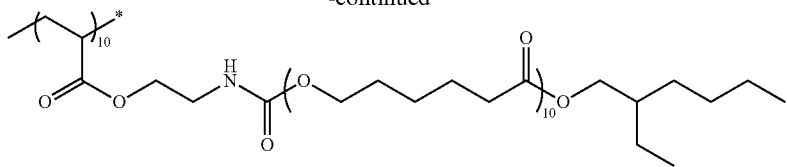
A-9: The following structure (linear resin (resin having no graft chain), weight-average molecular weight=10,000, acid value=51.7 mgKOH/g, base value=0 mgKOH/g, and the numeral value described in the repeating unit of the main chain is a molar ratio).
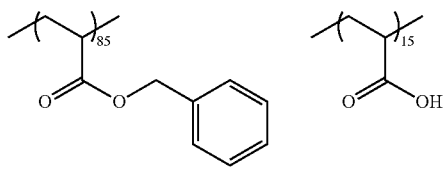
(Pigment Derivatives)
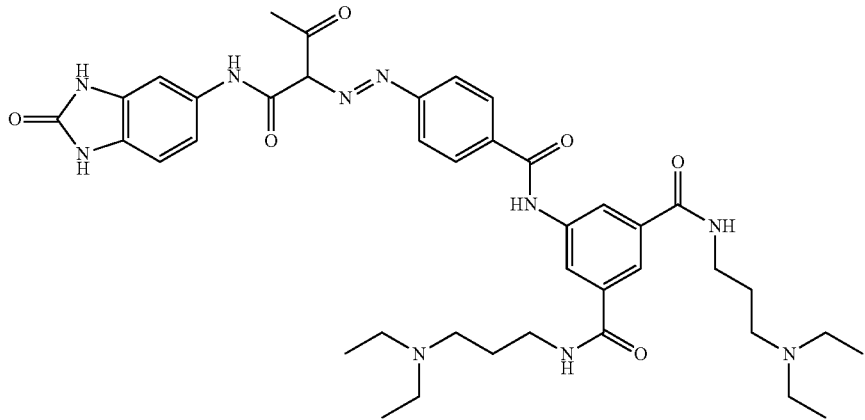
(P-1)
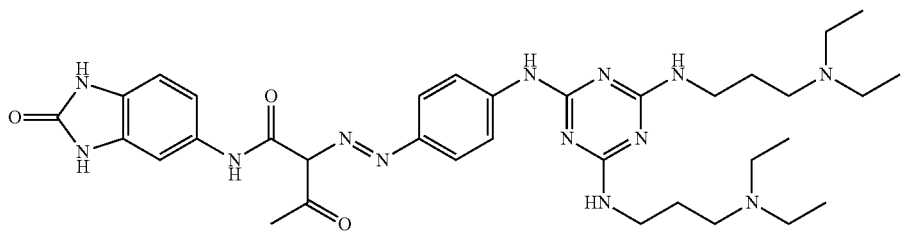
(P-2)
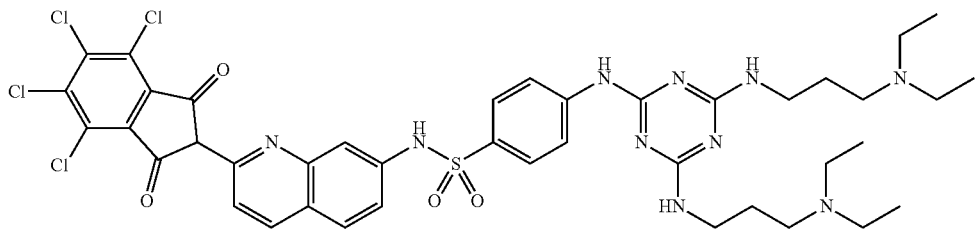
(P-3)
(Solvent)

-continued

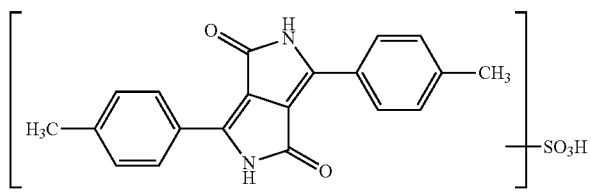

(P-4)

PGMEA: Propylene Glycol Monomethyl Ether Acetate

<Preparation of Coloring Composition>

The raw materials described in the following table were mixed, dispersed, and dissolved to obtain the respective coloring compositions of Examples and Comparative Examples.

TABLE 4

| | Pigment dispersion liquid A | | Pigment dispersion liquid B | | Photopolymerizable compound | | Photopolymerization initiator | |
|---|---|---|---|---|---|---|---|---|
| | Type | Addition amount (parts by mass) | Type | Addition amount (parts by mass) | Type | Addition amount (parts by mass) | Type | Addition amount (parts by mass) |
| Example 1 | 1-2 | 39.7 | Ye-1 | 18.5 | M-1 | 0.68 | Ini-1 | 0.40 |
| Example 2 | 1-2 | 39.7 | Ye-1 | 18.5 | M-2 | 0.68 | Ini-1 | 0.40 |
| Example 3 | 1-2 | 39.7 | Ye-1 | 18.5 | M-3 | 0.68 | Ini-1 | 0.40 |
| Example 4 | 1-2 | 39.7 | Ye-1 | 18.5 | M-1 | 0.68 | Ini-2 | 0.40 |
| Example 5 | 1-2 | 39.7 | Ye-1 | 18.5 | M-1 | 0.68 | Ini-3 | 0.40 |
| Example 6 | 1-2 | 39.7 | Ye-1 | 18.5 | M-1 | 0.68 | Ini-4 | 0.40 |
| Example 7 | 1-2 | 39.7 | Ye-1 | 18.5 | M-1 | 0.68 | Ini-1 | 0.40 |
| Example 8 | 1-2 | 35.7 | Ye-1 | 16.6 | M-1 | 0.79 | Ini-1 | 0.40 |
| Example 9 | 1-2 | 31.8 | Ye-1 | 14.8 | M-1 | 0.91 | Ini-1 | 0.40 |
| Example 10 | 1-2 | 39.7 | Ye-2 | 18.5 | M-1 | 0.68 | Ini-1 | 0.40 |
| Example 11 | 1-2 | 39.7 | Ye-3 | 18.5 | M-1 | 0.68 | Ini-1 | 0.40 |
| Example 12 | 1-1 | 39.7 | Ye-1 | 18.5 | M-1 | 0.68 | Ini-1 | 0.40 |
| Example 13 | 1-3 | 39.7 | Ye-1 | 18.5 | M-1 | 0.68 | Ini-1 | 0.40 |
| Example 14 | 1-4 | 39.7 | Ye-1 | 18.5 | M-1 | 0.68 | Ini-1 | 0.40 |
| Example 15 | 1-5 | 39.7 | Ye-1 | 18.5 | M-1 | 0.68 | Ini-1 | 0.40 |
| Example 16 | 1-6 | 39.7 | Ye-1 | 18.5 | M-1 | 0.68 | Ini-1 | 0.40 |
| Example 17 | 1-7 | 39.7 | Ye-1 | 18.5 | M-1 | 0.68 | Ini-1 | 0.40 |
| Example 18 | 1-8 | 39.7 | Ye-1 | 18.5 | M-1 | 0.68 | Ini-1 | 0.40 |
| Example 19 | 1-9 | 39.7 | Ye-1 | 18.5 | M-1 | 0.68 | Ini-1 | 0.40 |
| Example 20 | 1-10 | 58.2 | — | — | M-1 | 0.68 | Ini-1 | 0.40 |
| Example 21 | 1-11 | 58.2 | — | — | M-1 | 0.68 | Ini-1 | 0.40 |
| Example 22 | 1-12 | 58.2 | — | — | M-1 | 0.68 | Ini-1 | 0.40 |
| Example 23 | 1-13 | 39.7 | Ye-4 | 18.5 | M-1 | 0.68 | Ini-1 | 0.40 |
| Example 24 | 1-14 | 39.7 | Ye-4 | 18.5 | M-1 | 0.68 | Ini-1 | 0.40 |
| Example 25 | 1-15 | 58.2 | — | — | M-1 | 0.68 | Ini-1 | 0.40 |
| Example 26 | 1-16 | 58.2 | — | — | M-1 | 0.68 | Ini-1 | 0.40 |
| Example 27 | 1-17 | 58.2 | — | — | M-1 | 0.68 | Ini-1 | 0.40 |
| Example 28 | 1-18 | 39.7 | Ye-1 | 18.5 | M-1 | 0.68 | Ini-1 | 0.40 |

TABLE 4-continued

| | | | | | | | | |
|---|---|---|---|---|---|---|---|---|
| Example 29 | 1-19 | 39.7 | Ye-1 | 18.5 | M-1 | 0.68 | Ini-1 | 0.40 |
| Example 30 | 1-20 | 39.7 | Ye-1 | 18.5 | M-1 | 0.68 | Ini-1 | 0.40 |
| Example 31 | 1-21 | 39.7 | Ye-1 | 18.5 | M-1 | 0.68 | Ini-1 | 0.40 |
| Example 32 | 1-22 | 39.7 | Ye-1 | 18.5 | M-1 | 0.68 | Ini-1 | 0.40 |
| Example 33 | 1-23 | 39.7 | Ye-1 | 18.5 | M-1 | 0.68 | Ini-1 | 0.40 |
| Example 34 | 1-24 | 39.7 | Ye-1 | 18.5 | M-1 | 0.68 | Ini-1 | 0.40 |
| Example 35 | 1-25 | 39.7 | Ye-1 | 18.5 | M-1 | 0.68 | Ini-1 | 0.40 |
| Example 36 | 1-26 | 39.7 | Ye-1 | 18.5 | M-1 | 0.68 | Ini-1 | 0.40 |
| Example 37 | 1-27 | 58.2 | — | — | M-1 | 0.68 | Ini-1 | 0.40 |
| Example 38 | 1-28 | 58.2 | — | — | M-1 | 0.68 | Ini-1 | 0.40 |
| Example 39 | 1-29 | 58.2 | — | — | M-1 | 0.68 | Ini-1 | 0.40 |

| | Resin | | Surfactant | | Polymerization inhibitor | | Solvent | |
|---|---|---|---|---|---|---|---|---|
| | Type | Addition amount (parts by mass) | Type | Addition amount (parts by mass) | Type | Addition amount (parts by mass) | Type | Addition amount (parts by mass) |
| Example 1 | B-1 | 0.40 | W-1 | 0.01 | HQ | 0.001 | PGMEA | 40.4 |
| Example 2 | B-1 | 0.40 | W-1 | 0.01 | HQ | 0.001 | PGMEA | 40.4 |
| Example 3 | B-1 | 0.40 | W-1 | 0.01 | HQ | 0.001 | PGMEA | 40.4 |
| Example 4 | B-1 | 0.40 | W-1 | 0.01 | HQ | 0.001 | PGMEA | 40.4 |
| Example 5 | B-1 | 0.40 | W-1 | 0.01 | HQ | 0.001 | PGMEA | 40.4 |
| Example 6 | B-1 | 0.40 | W-1 | 0.01 | HQ | 0.001 | PGMEA | 40.4 |
| Example 7 | B-2 | 0.40 | W-1 | 0.01 | HQ | 0.001 | PGMEA | 40.4 |
| Example 8 | B-1 | 1.25 | W-1 | 0.01 | HQ | 0.001 | PGMEA | 45.2 |
| Example 9 | B-1 | 2.13 | W-1 | 0.01 | HQ | 0.001 | PGMEA | 50.0 |
| Example 10 | B-1 | 0.40 | W-1 | 0.01 | HQ | 0.001 | PGMEA | 40.4 |
| Example 11 | B-1 | 0.40 | W-1 | 0.01 | HQ | 0.001 | PGMEA | 40.4 |
| Example 12 | B-1 | 0.40 | W-1 | 0.01 | HQ | 0.001 | PGMEA | 40.4 |
| Example 13 | B-1 | 0.40 | W-1 | 0.01 | HQ | 0.001 | PGMEA | 40.4 |
| Example 14 | B-1 | 0.40 | W-1 | 0.01 | HQ | 0.001 | PGMEA | 40.4 |
| Example 15 | B-1 | 0.40 | W-1 | 0.01 | HQ | 0.001 | PGMEA | 40.4 |
| Example 16 | B-1 | 0.40 | W-1 | 0.01 | HQ | 0.001 | PGMEA | 40.4 |
| Example 17 | B-1 | 0.40 | W-1 | 0.01 | HQ | 0.001 | PGMEA | 40.4 |
| Example 18 | B-1 | 0.40 | W-1 | 0.01 | HQ | 0.001 | PGMEA | 40.4 |
| Example 19 | B-1 | 0.40 | W-1 | 0.01 | HQ | 0.001 | PGMEA | 40.4 |
| Example 20 | B-1 | 0.40 | W-1 | 0.01 | HQ | 0.001 | PGMEA | 40.4 |
| Example 21 | B-1 | 0.40 | W-1 | 0.01 | HQ | 0.001 | PGMEA | 40.4 |
| Example 22 | B-1 | 0.40 | W-1 | 0.01 | HQ | 0.001 | PGMEA | 40.4 |
| Example 23 | B-1 | 0.40 | W-1 | 0.01 | HQ | 0.001 | PGMEA | 40.4 |
| Example 24 | B-1 | 0.40 | W-1 | 0.01 | HQ | 0.001 | PGMEA | 40.4 |
| Example 25 | B-1 | 0.40 | W-1 | 0.01 | HQ | 0.001 | PGMEA | 40.4 |
| Example 26 | B-1 | 0.40 | W-1 | 0.01 | HQ | 0.001 | PGMEA | 40.4 |
| Example 27 | B-1 | 0.40 | W-1 | 0.01 | HQ | 0.001 | PGMEA | 40.4 |
| Example 28 | B-1 | 0.40 | W-1 | 0.01 | HQ | 0.001 | PGMEA | 40.4 |
| Example 29 | B-1 | 0.40 | W-1 | 0.01 | HQ | 0.001 | PGMEA | 40.4 |

TABLE 4-continued

| | | | | | | | | |
|---|---|---|---|---|---|---|---|---|
| Example 30 | B-1 | 0.40 | W-1 | 0.01 | HQ | 0.001 | PGMEA | 40.4 |
| Example 31 | B-1 | 0.40 | W-1 | 0.01 | HQ | 0.001 | PGMEA | 40.4 |
| Example 32 | B-1 | 0.40 | W-1 | 0.01 | HQ | 0.001 | PGMEA | 40.4 |
| Example 33 | B-1 | 0.40 | W-1 | 0.01 | HQ | 0.001 | PGMEA | 40.4 |
| Example 34 | B-1 | 0.40 | W-1 | 0.01 | HQ | 0.001 | PGMEA | 40.4 |
| Example 35 | B-1 | 0.40 | W-1 | 0.01 | HQ | 0.001 | PGMEA | 40.4 |
| Example 36 | B-1 | 0.40 | W-1 | 0.01 | HQ | 0.001 | PGMEA | 40.4 |
| Example 37 | B-1 | 0.40 | W-1 | 0.01 | HQ | 0.001 | PGMEA | 40.4 |
| Example 38 | B-1 | 0.40 | W-1 | 0.01 | HQ | 0.001 | PGMEA | 40.4 |
| Example 39 | B-1 | 0.40 | W-1 | 0.01 | HQ | 0.001 | PGMEA | 40.4 |

TABLE 5

| | Pigment Dispersion liquid A | | Pigment Dispersion liquid B | | Photo-polymerizable compound | | Photopolymerization initiator | |
|---|---|---|---|---|---|---|---|---|
| | Type | Addition amount (parts by mass) | Type | Addition amount (parts by mass) | Type | Addition amount (parts by mass) | Type | Addition amount (parts by mass) |
| Example 40 | 1-2 | 39.7 | Ye-1 | 18.5 | M-1 | 0.68 | Ini-5 | 0.40 |
| Example 41 | 1-2 | 39.7 | Ye-1 | 18.5 | M-2 | 0.68 | Ini-5 | 0.40 |
| Example 42 | 1-2 | 39.7 | Ye-1 | 18.5 | M-3 | 0.68 | Ini-5 | 0.40 |
| Example 43 | 1-2 | 39.7 | Ye-1 | 18.5 | M-1 | 0.68 | Ini-6 | 0.40 |
| Example 44 | 1-2 | 39.7 | Ye-1 | 18.5 | M-1 | 0.68 | Ini-5/Ini-6 | 0.20/0.20 |
| Example 45 | 1-2 | 39.7 | Ye-1 | 18.5 | M-3 | 0.68 | Ini-1/Ini-6 | 0.20/0.20 |
| Example 46 | 1-2 | 39.7 | Ye-1 | 18.5 | M-4 | 0.68 | Ini-1/Ini-6 | 0.20/0.20 |
| Example 47 | 1-2 | 38.0 | Ye-1 | 17.7 | M-3 | 1.36 | Ini-1 | 0.40 |
| Example 48 | 1-2 | 38.0 | Ye-1 | 17.7 | M-3 | 1.36 | Ini-1 | 0.60 |
| Example 49 | 1-2 | 39.7 | Ye-1 | 18.5 | M-4 | 0.68 | Ini-2 | 0.40 |
| Example 50 | 1-2 | 39.7 | Ye-1 | 18.5 | M-5 | 0.68 | Ini-2 | 0.40 |
| Example 51 | 1-2 | 39.7 | Ye-1 | 18.5 | M-5 | 0.68 | Ini-2 | 0.40 |
| Example 52 | 1-2 | 39.7 | Ye-1 | 18.5 | M-5 | 0.68 | Ini-2 | 0.40 |
| Example 53 | 1-2 | 39.7 | Ye-1 | 18.5 | M-1 | 0.68 | Ini-1 | 0.40 |
| Example 54 | 1-2 | 39.7 | Ye-1 | 18.5 | M-1 | 0.68 | Ini-1 | 0.40 |
| Example 55 | 1-2 | 39.7 | Ye-1 | 18.5 | M-1 | 0.68 | Ini-1 | 0.40 |
| Example 56 | 1-2 | 39.7 | Ye-1 | 18.5 | M-1 | 0.68 | Ini-1 | 0.40 |
| Example 57 | 1-2 | 39.7 | Ye-1 | 18.5 | M-1 | 0.68 | Ini-1 | 0.40 |
| Comparative Example 1 | R1-1 | 39.7 | Ye-R-1 | 18.5 | M-1 | 0.68 | Ini-1 | 0.40 |
| Comparative Example 2 | R1-2 | 39.7 | Ye-R-2 | 18.5 | M-1 | 0.68 | Ini-1 | 0.40 |
| Comparative Example 3 | R1-3 | 39.7 | Ye-R-1 | 18.5 | M-1 | 0.68 | Ini-1 | 0.40 |
| Comparative Example 4 | R1-4 | 39.7 | Ye-R-1 | 18.5 | M-1 | 0.68 | Ini-1 | 0.40 |
| Comparative Example 5 | R1-5 | 39.7 | Ye-R-1 | 18.5 | M-1 | 0.68 | Ini-1 | 0.40 |
| Comparative Example 6 | R1-6 | 39.7 | Ye-R-1 | 18.5 | M-1 | 0.68 | Ini-1 | 0.40 |
| Comparative Example 7 | R1-7 | 39.7 | Ye-R-2 | 18.5 | M-1 | 0.68 | Ini-1 | 0.40 |
| Comparative Example 8 | R1-8 | 39.7 | Ye-R-2 | 18.5 | M-1 | 0.68 | Ini-1 | 0.40 |
| Comparative Example 9 | R1-9 | 58.2 | — | — | M-1 | 0.68 | Ini-1 | 0.40 |
| Comparative Example 10 | R1-10 | 58.2 | — | — | M-1 | 0.68 | Ini-1 | 0.40 |
| Comparative Example 11 | R1-11 | 58.2 | — | — | M-1 | 0.68 | Ini-1 | 0.40 |

TABLE 5-continued

|  | Resin | | Surfactant | | Polymerization inhibitor | | Solvent | |
| --- | --- | --- | --- | --- | --- | --- | --- | --- |
|  | Type | Addition amount (parts by mass) | Type | Addition amount (parts by mass) | Type | Addition amount (parts by mass) | Type | Addition amount (parts by mass) |
| Example 40 | B-1 | 0.40 | W-1 | 0.01 | HQ | 0.001 | PGMEA | 40.4 |
| Example 41 | B-1 | 0.40 | W-1 | 0.01 | HQ | 0.001 | PGMEA | 40.4 |
| Example 42 | B-1 | 0.40 | W-1 | 0.01 | HQ | 0.001 | PGMEA | 40.4 |
| Example 43 | B-1 | 0.40 | W-1 | 0.01 | HQ | 0.001 | PGMEA | 40.4 |
| Example 44 | B-1 | 0.40 | W-1 | 0.01 | HQ | 0.001 | PGMEA | 40.4 |
| Example 45 | B-1 | 0.40 | W-1 | 0.01 | HQ | 0.001 | PGMEA | 40.4 |
| Example 46 | B-1 | 0.40 | W-1 | 0.01 | HQ | 0.001 | PGMEA | 40.4 |
| Example 47 | B-1 | 2.10 | W-1 | 0.01 | HQ | 0.001 | PGMEA | 40.4 |
| Example 48 | B-1 | 1.90 | W-1 | 0.01 | HQ | 0.001 | PGMEA | 40.4 |
| Example 49 | B-1 | 0.40 | W-1 | 0.01 | HQ | 0.001 | PGMEA | 40.4 |
| Example 50 | B-1 | 0.40 | W-1 | 0.01 | HQ | 0.001 | PGMEA | 40.4 |
| Example 51 | B-2 | 0.40 | W-1 | 0.01 | HQ | 0.001 | PGMEA | 40.4 |
| Example 52 | B-2 | 0.40 | W-1 | 0.01 | HQ | 0.001 | PGMEA/ ANONE | 25.2/ 15.1 |
| Example 53 | B-1 | 0.40 | W-2 | 0.01 | HQ | 0.001 | PGMEA | 40.4 |
| Example 54 | B-1 | 0.40 | W-3 | 0.01 | HQ | 0.001 | PGMEA | 40.4 |
| Example 55 | B-1 | 0.40 | W-4 | 0.01 | HQ | 0.001 | PGMEA | 40.4 |
| Example 56 | B-1 | 0.40 | W-1 | 0.01 | BHT | 0.001 | PGMEA | 40.4 |
| Example 57 | B-1 | 0.40 | W-1 | 0.01 | Cupferron | 0.001 | PGMEA | 40.4 |
| Comparative Example 1 | B-1 | 0.40 | W-1 | 0.01 | HQ | 0.001 | PGMEA | 40.4 |
| Comparative Example 2 | B-1 | 0.40 | W-1 | 0.01 | HQ | 0.001 | PGMEA | 40.4 |
| Comparative Example 3 | B-1 | 0.40 | W-1 | 0.01 | HQ | 0.001 | PGMEA | 40.4 |
| Comparative Example 4 | B-1 | 0.40 | W-1 | 0.01 | HQ | 0.001 | PGMEA | 40.4 |
| Comparative Example 5 | B-1 | 0.40 | W-1 | 0.01 | HQ | 0.001 | PGMEA | 40.4 |
| Comparative Example 6 | B-1 | 0.40 | W-1 | 0.01 | HQ | 0.001 | PGMEA | 40.4 |
| Comparative Example 7 | B-1 | 0.40 | W-1 | 0.01 | HQ | 0.001 | PGMEA | 40.4 |
| Comparative Example 8 | B-1 | 0.40 | W-1 | 0.01 | HQ | 0.001 | PGMEA | 40.4 |
| Comparative Example 9 | B-1 | 0.40 | W-1 | 0.01 | HQ | 0.001 | PGMEA | 40.4 |
| Comparative Example 10 | B-1 | 0.40 | W-1 | 0.01 | HQ | 0.001 | PGMEA | 40.4 |
| Comparative Example 11 | B-1 | 0.40 | W-1 | 0.01 | HQ | 0.001 | PGMEA | 40.4 |

The raw materials described in the above table are as follows.

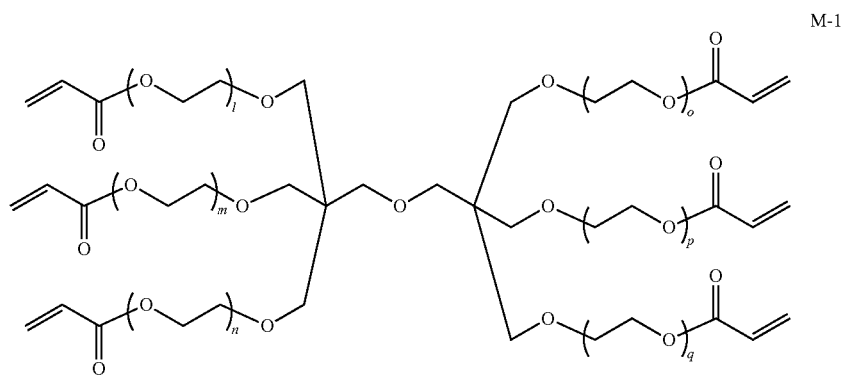

M-1

$l + m + n + o + p + q = 12$

-continued
M-2
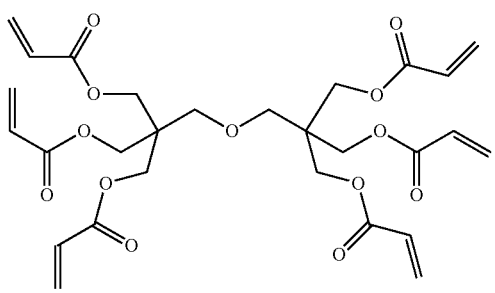
M-3
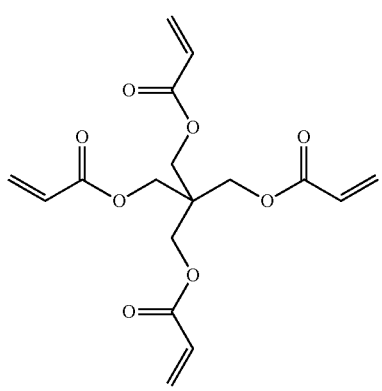
(Photopolymerizable Compounds)
M-4: M-305 (manufactured by Toagosei Co., Ltd.)
M-5: ARONIX TO-2349 (manufactured by Toagosei Co., Ltd.)
(Photopolymerization Initiators)
Ini-1: IRGACURE OXE 02
Ini-2: IRGACURE OXE 01
Ini-3: IRGACURE 369
Ini-4: IRGACURE 379EG
Ini-5: ADEKA ARKLS NCI-831
Ini-6: The following structure
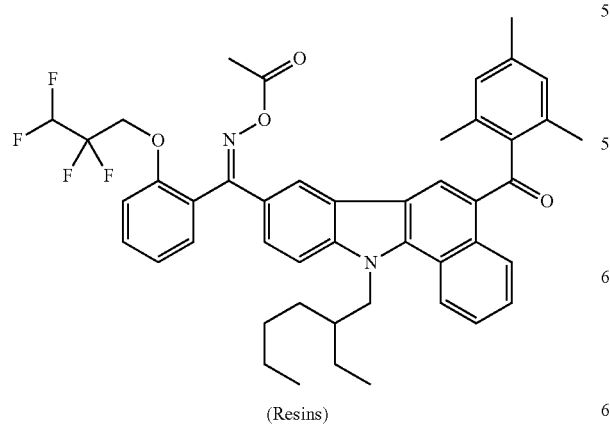
(Resins)
-continued
B-1
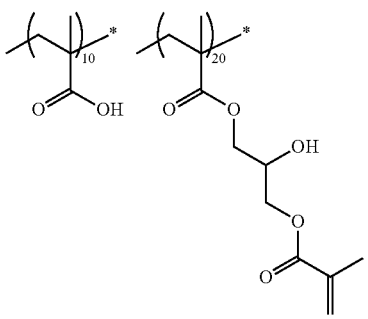
(Mw = 13500)
B-2
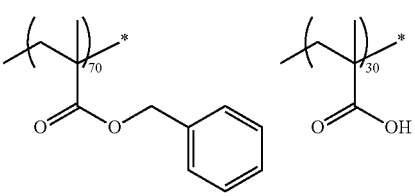
(Mw = 12000)
(Surfactants)

W-1: The following mixture (Mw=14000)

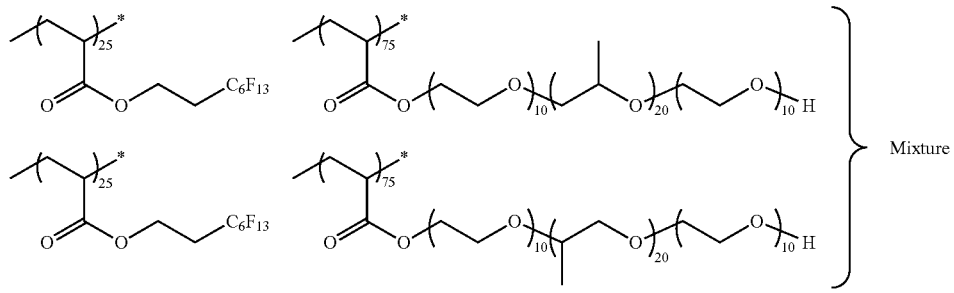

W-2: KF6001 (Shin-Etsu silicone)
W-3: PIONIN D-6112-W (TAKEMOTO OIL & FAT Co., Ltd.)
W-4: PIONIN D-6315 (TAKEMOTO OIL & FAT Co., Ltd.)
(Polymerization Inhibitors)
HQ: p-Methoxyphenol
BHT: Di-t-butyl-p-cresol
Cupferron: N-Nitrosophenylhydroxyamine ammonium salt
(Solvents)
PGMEA: Propylene glycol monomethyl ether acetate
ANONE: Cyclohexanone <Pattern Shapes and Residue Evaluation>

The coloring composition obtained above was coated on a 200-mm (8-inch) silicon wafer having an undercoat layer attached thereonto, such that the film thickness after coating became 0.8 μm, by a spin coating method, and then heated at 90° C. for 2 minutes on a hot plate, to obtain a colored layer.

Thereafter, for the obtained colored layer, a 1.0-μm² island pattern was exposed (at an exposure dose of 50 to 1,700 mJ/cm²) through a mask, using an i-line stepper exposure device FPA-3000i5+ (manufactured by Canon Inc.).

Then, for the exposed colored layer, the developability was evaluated using a developing device (Act8 manufactured by Tokyo Electron Limited). An aqueous tetramethyl-ammonium hydroxide (TMAH) solution at 0.3% by mass was used as the developer and a shower development was carried out under the condition of 23° C. for 60 seconds. Then, rinsing was carried out with a spin shower using pure water to obtain a pattern. The distortion of the obtained pattern (pattern shape) was evaluated with a scanning electron microscope (SEM) (S-4800H, manufactured by Hitachi High-Technologies Corporation) (magnification: 20,000).

The evaluation standards for the pattern distortion and the residues are as follows.

Figure 1B:
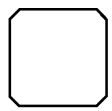
Figure 1C:
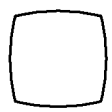
Figure 1D:
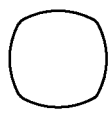
Figure 1E:
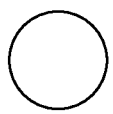

(Evaluation Standard for Pattern Shapes)
A: As in FIG. 1A, one side of the pattern is straight and the corners of the pattern are not rounded.
B: As in FIG. 1B, one side of the pattern is straight but the corners of the pattern are slightly rounded.
C: As in FIG. 1C, the corners of the pattern are slightly rounded and one side of the pattern is slightly rounded.
D: As in FIG. 1D, the corners of the pattern are rounded.
E: As in FIG. 1E, the pattern is rounded.

(Evaluation Standard for Pattern Residues)
The size of the residue in the following respective standards is the diameter of a circle which circumscribes the observed maximal residue.

A: There is no residue on the non-image area between the patterns.
B: Residues having a size of less than 0.01 μm in the non-image area between the patterns are observed.
C: Residues having a size of 0.01 μm or more and less than 0.05 μm in the non-image area between the patterns are observed.
D: Residues having a size of 0.05 μm or more and less than 0.10 μm in the non-image area between the patterns are observed.
E: Residues having a size of 0.10 μm or more in the non-image area between the patterns are observed.

<Evaluation of Gel Defects>

After being stored at 45° C. for 3 days, the coloring composition obtained above was coated on a 200-mm (8-inch) silicon wafer such that the film thickness after coating became 0.8 μm, by a spin coating method, then heated at 100° C. for 2 minutes on a hot plate, and further heated at 200° C. for 10 minutes on a hot plate to obtain a colored layer. For the substrate having the colored layer formed thereon, the defects in the gel state having a size of 1 μm or more was measured using a defect inspection device ComPlus (manufactured by Applied Materials).

<Evaluation of Brightness Unevenness>

The coloring composition obtained above was coated on a glass substrate such that the film thickness after drying became 0.8 μm, using a spin coater, and pre-baked at 100° C. for 120 seconds to obtain a colored layer.

The obtained colored layer was disposed between the objective lens and the light source of an optical microscope equipped with a digital camera of a magnification of 1,000, light was irradiated toward the objective lens, and the state of the transmitted light was observed. The digital camera provided in this optical microscope had a CCD having 1.28 million pixels installed therein, and the digital camera took shot images of the film surface through which light was transmitted. The images taken were stored as digitally converted data (digital images) in an 8-bit bitmap format.

In addition, the image of the film surface of the colored layer was performed at 20 arbitrarily selected areas. Further, the digitally converted data were stored after digitalizing the brightness of the three primary colors of RGB (Red•Green•Blue) of each of the taken images into a density distribution of a scale of 256 tones from 0 to 255.

Subsequently, the stored digital image was compartmentalized in a lattice form so that the size of one lattice was corresponding to 0.5 μm² on the actual substrate, and the brightness within one compartment was averaged. In the present Example, since images were taken at an optical magnification of 1,000 with a digital camera with 1.28 million pixels, 0.5 μm on the actual substrate corresponded to 0.5 mm on the image taken. Thus, since the image sized on the display was 452 mm×352 mm, the total number of compartments in a single area was 636,416.

For all of the compartments, the average brightness of one arbitrary compartment and the average brightness of all the compartments adjacent thereto were measured. If the difference between the average brightness of the one arbitrary compartment as measured above and the average brightness of the adjacent compartments was 5% or more, such compartment was considered as a compartment with significant difference. The average total number of the compartments with significant difference in the entire area was calculated, and the brightness unevenness was evaluated in accordance with the following standard. As the numeral value is smaller, the difference in the concentration is smaller and the brightness unevenness is less, showing excellent characteristics as a color filter.

A: The number of the compartments with significant difference is 2,000 or less.

B: The number of the compartments with significant difference is 2,001 to 3,000.

C: The number of the compartments with significant difference is 3,001 to 5,000.

D: The number of the compartments with significant difference is 5,001 to 10,000.

E: The number of the compartments with significant difference is 10,001 or more.

<Evaluation of Temporal Stability>

A viscosity change between the viscosity after preparation and the viscosity after aging in an environment with a temperature of 45° C. and a humidity of 50% for 3 months, for the coloring composition obtained above, was measured, and the temporal stability was evaluated. The viscosity was measured using an E-type rotation viscometer RE85L manufactured by Toki Sangyo Co., Ltd. and a standard cone/rotor (1° 34'×R24), setting the rotation speed to 20 rpm, and adjusting a sample cup to a temperature of 23° C.±0.2° C.

A: The change in viscosity between before the aging test and after the aging test is 3.0% or less.

B: The change in viscosity between before the aging test and after the aging test is more than 3.0% and 5.0% or less.

C: The change in viscosity between before the aging test and after the aging test is more than 5.0% and 10.0% or less.

D: The change in viscosity between before the aging test and after the aging test is more than 10.0% and 20.0% or less.

E: The change in viscosity between before the aging test and after the aging test is more than 20.0%.

TABLE 6

| | Pattern shape | Pattern residue | Gel defects | Brightness unevenness | Temporal stability |
|---|---|---|---|---|---|
| Example 1 | A | A | 6 | A | A |
| Example 2 | A | B | 7 | A | A |
| Example 3 | A | B | 7 | A | A |
| Example 4 | A | A | 6 | A | A |
| Example 5 | B | A | 6 | A | A |
| Example 6 | B | A | 6 | A | A |
| Example 7 | B | A | 7 | A | A |
| Example 8 | A | A | 6 | A | A |
| Example 9 | A | A | 6 | A | A |
| Example 10 | A | A | 30 | C | A |
| Example 11 | A | A | 15 | B | A |
| Example 12 | A | A | 15 | C | A |
| Example 13 | A | B | 6 | A | B |
| Example 14 | A | A | 10 | A | A |
| Example 15 | A | A | 6 | A | A |
| Example 16 | A | A | 12 | B | B |

TABLE 6-continued

| | Pattern shape | Pattern residue | Gel defects | Brightness unevenness | Temporal stability |
|---|---|---|---|---|---|
| Example 17 | A | A | 11 | B | B |
| Example 18 | A | A | 25 | C | C |
| Example 19 | A | A | 33 | C | C |
| Example 20 | A | A | 6 | A | B |
| Example 21 | A | A | 33 | C | B |
| Example 22 | A | A | 16 | B | B |
| Example 23 | B | C | 45 | C | C |
| Example 24 | B | C | 44 | C | C |
| Example 25 | B | C | 50 | C | C |
| Example 26 | B | C | 60 | C | C |
| Example 27 | B | C | 55 | C | C |
| Example 28 | C | C | 8 | A | A |
| Example 29 | C | C | 8 | A | A |
| Example 30 | B | B | 8 | A | A |
| Example 31 | C | C | 45 | C | C |
| Example 32 | C | C | 45 | C | C |
| Example 33 | C | C | 45 | C | C |
| Example 34 | C | C | 55 | C | C |
| Example 35 | C | C | 40 | C | C |
| Example 36 | C | C | 55 | C | C |
| Example 37 | C | C | 8 | A | B |
| Example 38 | C | C | 35 | C | B |
| Example 39 | C | C | 18 | B | B |

TABLE 7

| | Pattern shape | Pattern residue | Gel defects | Brightness unevenness | Temporal stability |
|---|---|---|---|---|---|
| Example 40 | A | A | 3 | A | A |
| Example 41 | A | A | 3 | A | A |
| Example 42 | A | A | 3 | A | A |
| Example 43 | A | A | 3 | A | A |
| Example 44 | A | A | 3 | A | A |
| Example 45 | A | A | 3 | A | A |
| Example 46 | A | B | 3 | A | A |
| Example 47 | A | B | 7 | A | A |
| Example 48 | A | B | 7 | A | A |
| Example 49 | A | A | 12 | A | A |
| Example 50 | A | A | 12 | A | A |
| Example 51 | C | A | 12 | A | A |
| Example 52 | C | A | 12 | A | A |
| Example 53 | A | A | 6 | A | A |
| Example 54 | A | A | 6 | A | A |
| Example 55 | A | A | 6 | A | A |
| Example 56 | A | A | 6 | A | A |
| Example 57 | A | A | 6 | A | A |
| Comparative Example 1 | E | E | 100 or more | E | E |
| Comparative Example 2 | D | D | 100 or more | E | E |
| Comparative Example 3 | E | E | 100 or more | E | E |
| Comparative Example 4 | E | E | 100 or more | E | E |
| Comparative Example 5 | E | E | 100 or more | E | E |
| Comparative Example 6 | E | E | 73 | B | B |
| Comparative Example 7 | C | D | 100 or more | E | E |
| Comparative Example 8 | C | D | 100 or more | E | E |
| Comparative Example 9 | E | E | 80 | B | B |
| Comparative Example 10 | E | E | 85 | B | B |
| Comparative Example 11 | E | E | 86 | B | B |

As apparent from the results, in Examples, there were little pattern residues. Further, the pattern shapes were good, and there were little gel defects and brightness unevenness. In addition, the temporal stability of the compositions was good.

In contrast, in Comparative Examples, the pattern residues were deteriorated. In addition, at least one of the pattern shape, the gel defects, the brightness unevenness, and the temporal stability was deteriorated.

What is claimed is:

1. A coloring composition comprising:
Color Index Pigment Red 264;
a graft resin having an acid group;
a photopolymerizable compound; and
a photopolymerization initiator.

2. The coloring composition according to claim 1, wherein the graft resin having an acid group has a base value of 50 mgKOH/g or less.

3. The coloring composition according to claim 1, wherein the graft resin having an acid group has an acid value of 5 to 150 mgKOH/g.

4. The coloring composition according to claim 1, further comprising a pigment derivative having a basic group.

5. The coloring composition according to claim 4, wherein the pigment derivative is a compound represented by the following General Formula (P), A-B-(-C-D-E)$_t$     (P)

in General Formula (P), A represents a group represented by the following General Formula (PA-1) or (PA-2),
B represents a single bond or a (t+1)-valent linking group,
C represents a single bond, —NR—, —CO—, —CO$_2$—, —SO$_2$—, —O—, —S—, or a group formed of a combination thereof, and R represents a hydrogen atom, an alkyl group, or an aryl group,
D represents a single bond, an alkylene group, or an arylene group,
E represents —N(Rpa)(Rpb),
Rpa and Rpb each independently represent an alkyl group or an aryl group, and
t represents an integer of 1 to 5;

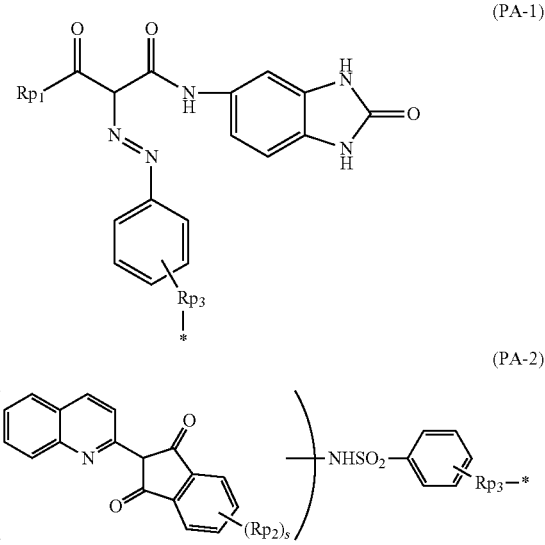

Rp$_1$ represents an alkyl group or an aryl group,
Rp$_2$ represents a hydrogen atom, a halogen atom, an alkyl group, or a hydroxyl group,
Rp$_3$ represents a single bond, —NR—, —CO—, —CO$_2$—, —SO$_2$—, —O—, —S—, or a group formed of a combination thereof, and R represents a hydrogen atom, an alkyl group, or an aryl group,
s represents an integer of 1 to 4, and in a case where s is 2 or more, a plurality of Rp$_2$'s may be the same or different from each other, and
* represents a linking moiety to B.

6. The coloring composition according to claim 5, further comprising Color Index Pigment Yellow 139.

7. The coloring composition according to claim 5, wherein the graft resin having an acid group is a (meth)acrylic resin.

8. The coloring composition according to claim 5, wherein the graft resin having an acid group has a carboxyl group.

9. The coloring composition according to claim 1, further comprising Color Index Pigment Yellow 139.

10. The coloring composition according to claim 9, wherein the mass ratio of Color Index Pigment Red 264 to Color Index Pigment Yellow 139 is 55:45 to 75:25.

11. The coloring composition according to claim 9, wherein the graft resin having an acid group is a (meth)acrylic resin.

12. The coloring composition according to claim 9, wherein the graft resin having an acid group has a carboxyl group.

13. The coloring composition according to claim 1, wherein the graft resin having an acid group is a (meth)acrylic resin.

14. The coloring composition according to claim 1, wherein the graft resin having an acid group has a carboxyl group.

15. A method for producing the coloring composition according to claim 1, comprising:
dispersing a colorant including Color Index Pigment Red 264 in the presence of a graft resin having an acid group.

16. A color filter formed of the coloring composition according to claim 1.

17. A solid-state imaging element comprising the color filter according to claim 16.

18. An image display device comprising the color filter according to claim 16.

19. A pattern forming method comprising:
forming a coloring composition layer on a support applying the coloring composition according to claim 1,
exposing the coloring composition layer in a pattern shape; and
removing the unexposed area by development to form a colored pattern.

20. A method for manufacturing a color filter, comprising the pattern forming method according to claim 19.

* * * * *